(12) United States Patent
Kong et al.

(10) Patent No.: US 11,848,399 B2
(45) Date of Patent: Dec. 19, 2023

(54) METHOD OF MANUFACTURING DISPLAY APPARATUS AND THE DISPLAY APPARATUS

(71) Applicant: SAMSUNG ELECTRONICS CO., LTD., Suwon-si (KR)

(72) Inventors: Kiho Kong, Suwon-si (KR); Junhee Choi, Seongnam-si (KR); Deukseok Chung, Yongin-si (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/569,217

(22) Filed: Jan. 5, 2022

(65) Prior Publication Data
US 2022/0131030 A1 Apr. 28, 2022

Related U.S. Application Data

(63) Continuation of application No. 16/666,593, filed on Oct. 29, 2019, now Pat. No. 11,251,331.

(30) Foreign Application Priority Data

Dec. 19, 2018 (KR) .......................... 10-2018-0165370

(51) Int. Cl.
*H01L 33/00* (2010.01)
*G09G 3/32* (2016.01)
(Continued)

(52) U.S. Cl.
CPC ........... *H01L 33/0095* (2013.01); *G09G 3/32* (2013.01); *H01L 33/504* (2013.01); *H01L 33/62* (2013.01);
(Continued)

(58) Field of Classification Search
None
See application file for complete search history.

(56) References Cited

U.S. PATENT DOCUMENTS 8,614,591 B2 12/2013 Kim et al.
9,423,832 B2 8/2016 Jeoung et al.
(Continued)

FOREIGN PATENT DOCUMENTS

CN 1706226 A 12/2005
EP 3291303 A1 3/2018
(Continued)

OTHER PUBLICATIONS

Communication dated May 18, 2020, from the European Patent Office in counterpart European Application No. 19210620.1.
(Continued)

*Primary Examiner* — Khaja Ahmad
(74) *Attorney, Agent, or Firm* — Sughrue Mion, PLLC

(57) ABSTRACT

Provided are a method of manufacturing a display apparatus and the display apparatus. The method includes forming an emissive layer and a driving layer on a first area of a substrate, forming an exposure line electrically connected to the driving layer, on a second area of the substrate, and forming a color conversion layer on the driving layer by emitting light from the emissive layer using the exposure line.

20 Claims, 21 Drawing Sheets

(51) Int. Cl.
    *H01L 33/50*     (2010.01)
    *H01L 33/62*     (2010.01)

(52) U.S. Cl.
    CPC ............... *G09G 2310/0267* (2013.01); *G09G 2310/0275* (2013.01); *H01L 2933/0041* (2013.01); *H01L 2933/0066* (2013.01)

(56) References Cited

U.S. PATENT DOCUMENTS

| | | | |
|---|---|---|---|
| 10,453,903 B2 | 10/2019 | Bae et al. | |
| 2003/0035081 A1* | 2/2003 | Jung | G02F 1/1345 349/152 |
| 2005/0020174 A1 | 1/2005 | Makifuchi et al. | |
| 2005/0030468 A1* | 2/2005 | Jung | G02F 1/13458 349/190 |
| 2006/0007077 A1 | 1/2006 | Joo et al. | |
| 2006/0012296 A1 | 1/2006 | Eida et al. | |
| 2013/0169697 A1* | 7/2013 | Park | G09G 3/2081 345/83 |
| 2016/0035805 A1* | 2/2016 | Kim | H10K 50/813 345/76 |
| 2016/0062183 A1 | 3/2016 | Sung et al. | |
| 2017/0097510 A1 | 4/2017 | Sohn | |
| 2017/0139277 A1 | 5/2017 | Szwarcman et al. | |
| 2017/0170220 A1 | 6/2017 | Nam et al. | |
| 2017/0194382 A1 | 7/2017 | Lee et al. | |
| 2021/0217777 A1 | 7/2021 | Chung et al. | |

FOREIGN PATENT DOCUMENTS

| | | |
|---|---|---|
| GB | 2341486 A | 3/2000 |
| JP | 2009-139459 A | 6/2009 |
| KR | 10-2011-0037638 A | 4/2011 |
| KR | 10-2015-0104462 A | 9/2015 |
| KR | 10-2015-0108650 A | 9/2015 |
| KR | 10-2017-0020675 A | 2/2017 |
| KR | 10-2018-0133192 A | 12/2018 |

OTHER PUBLICATIONS

Communication dated Jun. 8, 2023 by the Chinese Patent Office in Chinese Application No. 201911075614.5.

Communication dated Oct. 13, 2023 by the Korean Intellectual Property Office in counterpart Korean Patent Application No. 10-2018-0165370.

* cited by examiner

METHOD OF MANUFACTURING DISPLAY APPARATUS AND THE DISPLAY APPARATUS

CROSS-REFERENCE TO RELATED APPLICATION

This application is a continuation of U.S. application Ser. No. 16/666,593 filed Oct. 29, 2019, which is based on and claims priority under 35 U.S.C. § 119 from Korean Patent Application No. 10-2018-0165370, filed on Dec. 19, 2018, in the Korean Intellectual Property Office, the disclosure of which is incorporated herein in its entirety by reference.

BACKGROUND

1. Field

The disclosure relates to methods of manufacturing a display apparatus having a small pixel size and the display apparatus having the small pixel size.

2. Description of the Related Art

Liquid crystal displays (LCD) and organic light-emitting diode (OLED) displays are widely used as display apparatuses. Recently, the technique of manufacturing a high-resolution display apparatus by using a micro-light-emitting diode (LED) has been drawing attention. However, highly efficient compact LED chips are needed for the manufacture of high-resolution display apparatuses, and a difficult transfer technique is required to arrange compact LED chips at appropriate positions.

SUMMARY

Provided are methods of manufacturing a display apparatus, in which a color conversion layer is formed by using light emission in the display apparatus itself.

Additional aspects will be set forth in part in the description which follows and, in part, will be apparent from the description, or may be learned by practice of the presented embodiments.

According to an aspect of the disclosure, there is provided a method of manufacturing a display apparatus, the method comprising: forming an emissive layer on a first area of a substrate; forming, on the emissive layer, a driving layer comprising a plurality of driving elements used to emit light from the emissive layer; forming an exposure line on a second area of the substrate, the exposure line being electrically connected to the driving layer; and forming a color conversion layer on the driving layer by emitting the light from the emissive layer by using the exposure line.

The forming of the emissive layer may comprise forming a plurality of light-emission areas respectively corresponding to a plurality of pixels, and connecting the plurality of light-emission areas to each other via dummy areas of the emissive layer.

The forming of the driving layer may comprise forming a plurality of scan lines extending in a first direction; and forming a plurality of data lines extending in a second direction intersecting the first direction, wherein the plurality of driving elements are respectively connected to the plurality of scan lines and the plurality of data lines, and the plurality of data lines are electrically connected to the exposure line.

The exposure line may extend in a direction intersecting the second direction.

The exposure line may extend in the first direction.

The forming of the exposure line may comprise forming a first exposure line for forming a first color conversion layer; and forming a second exposure line for forming a second color conversion layer, wherein the first exposure line is connected to a first group data line from among the plurality of data lines, and the second exposure line is connected to a second group data line from among the plurality of data lines.

The forming of the color conversion layer may comprise forming a first color conversion material on the driving layer; applying a first signal to the first exposure line to emit first light from a first area of the emissive layer corresponding to the first group data line; forming a first color conversion layer by hardening a portion of the first color conversion material that overlaps the first area of the emissive layer based on the first signal applied to the first exposure line; and removing a portion of the first color conversion material that is not hardened.

The method may further comprise forming a second color conversion material on the driving layer; applying a second signal to the second exposure line to emit second light from a second area of the emissive layer corresponding to the second group data line; forming a second color conversion layer by hardening a portion of the second color conversion material that overlaps the second area of the emissive layer based on the second signal applied to the second exposure line; and removing a portion of the second color conversion material that is not hardened.

When an on signal is applied to the first exposure line, an off signal is may be applied to the second exposure line, and when an on signal is applied to the second exposure line, an off signal may be applied to the first exposure line.

The method may further comprise applying a third signal to the first exposure line and the second exposure line to discharge a charge in the emissive layer and the plurality of driving elements.

The forming of the color conversion layer may be performed while a scan signal is applied to the plurality of scan lines.

The forming of the color conversion layer may be performed while an on signal is applied to the plurality of scan lines.

The exposure line may be directly connected to one or more of the plurality of data lines.

The exposure line may be electrically connected to the plurality of data lines via a switching device.

The switching device may comprise a plurality of transistors which electrically connect each of the plurality of data lines to the exposure line.

The switching device may comprise a multiplexer.

The method may further comprise, after forming the color conversion layer, separating the substrate into a third area including the emissive layer and fourth area including the exposure line, and removing the fourth area from the third area.

The method may further comprise, before forming the color conversion layer, forming a plurality of barriers defining a pixel on the driving layer.

At least one of the plurality of barriers may have a tapered shape with a width decreasing from a lower portion to an upper portion thereof.

A size of the pixel may be 500 ppi or more.

The emissive layer, the driving layer, the exposure line, and the color conversion layer may be monolithically formed.

According to another aspect of the disclosure, there is provided a display apparatus comprising: a plurality of scan lines extending in a first direction; a plurality of data lines extending in a second direction intersecting the first direction; a plurality of pixels respectively corresponding to the plurality of scan lines and the plurality of data lines; a plurality of first electrode pads electrically connected to the plurality of scan lines; a plurality of second electrode pads electrically connected to the plurality of data lines; a scan driver configured to apply a scan signal to the plurality of scan lines through the first electrode pads; a data driver configured to apply a data signal to the plurality of data lines through the plurality of second electrode pads; and a plurality of first dummy lines protruding from the second electrode pads in a same direction as the plurality of data lines.

The display apparatus may further comprise a plurality of second dummy lines protruding from the first electrode pads in a same direction as the plurality of scan lines.

According to another aspect of the disclosure, there is provided a semiconductor device comprising: a substrate; an emissive layer provided on a substrate; a driving layer provided on the emissive layer; a semiconductor layer self-formed on the driving layer, the semiconductor layer hardened based on light emitted from the emissive layer.

The self-formed layer may be a color conversion layer.

The semiconductor layer may comprise quantum dots.

According to another aspect of the disclosure, there is provided a method of manufacturing a semiconductor device comprising: providing an emissive layer on a substrate; providing a driving layer provided on the emissive layer; providing a semiconductor layer formed on the driving layer; and hardening the semiconductor layer based on light emitted from the emissive layer.

The semiconductor layer may be a color conversion layer.

The semiconductor layer may comprise quantum dots.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
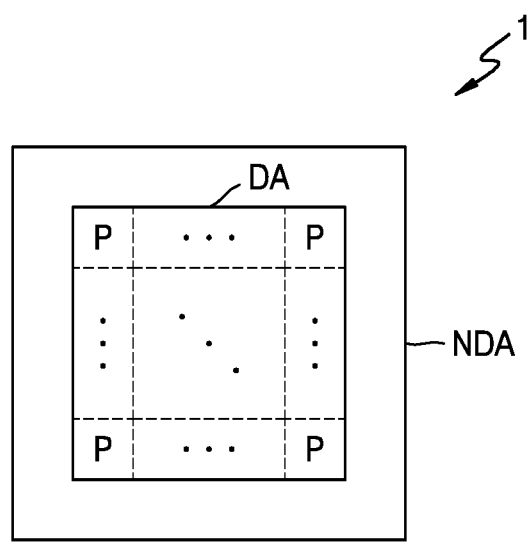
FIG. 1 is a schematic plan view of a display apparatus according to an embodiment of the disclosure.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. Expressions such as "at least one of," when preceding a list of elements, modify the entire list of elements and do not modify the individual elements of the list.

The disclosure will now be described more fully with reference to the accompanying drawings, in which embodiments of the disclosure are shown. In the drawings, like reference numerals denote like elements, and sizes of elements in the drawings may be exaggerated for clarity and convenience of description. Embodiments described herein are examples only, and may include various modifications.

Throughout the specification, it will also be understood that when an element is referred to as being "on" another element, it can be directly on the other element, or intervening elements may also be present.

An expression used in the singular form encompasses the expression in the plural form, unless it has a clearly different meaning in the context. It is to be understood that the terms such as "including", etc., are intended to indicate the existence of the components, and are not intended to preclude the possibility that one or more other components may be added.

While such terms as "first," "second," etc., may be used herein, the above terms are used only to distinguish one element from another.

Figure 2:
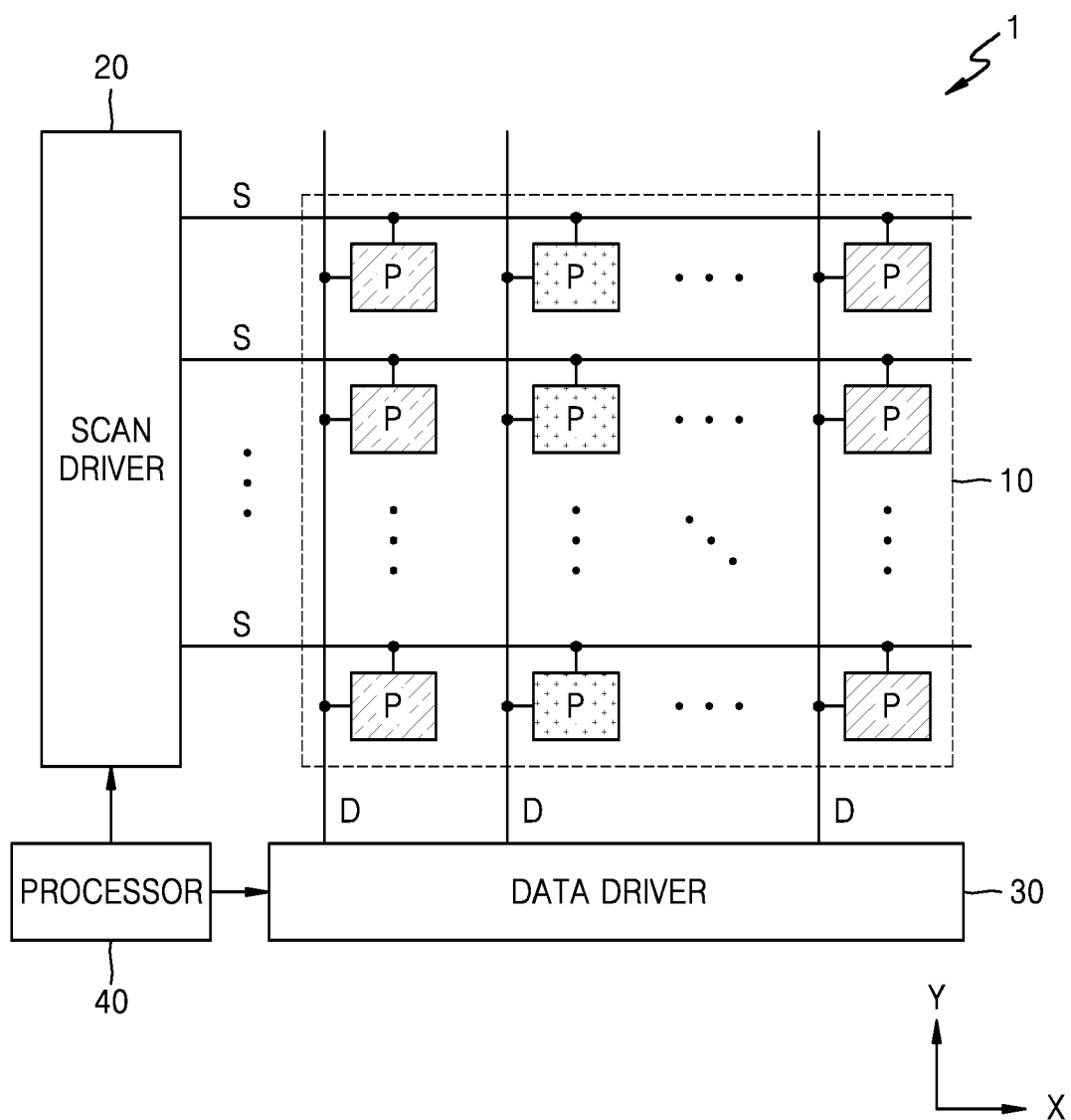
FIG. 2 is a block diagram illustrating the display apparatus of FIG. 1.
Figure 3:
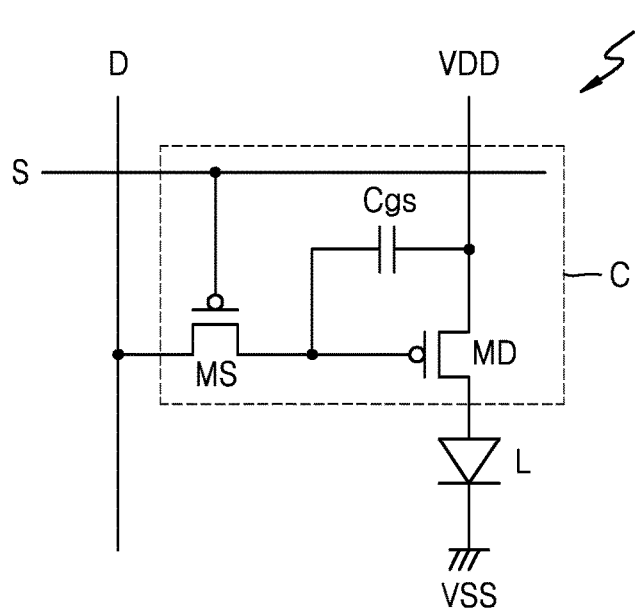
FIG. 3 is a circuit diagram of a pixel included in the display apparatus of FIG. 1.

FIG. 1 is a schematic plan view of a display apparatus 1 according to an embodiment of the disclosure. FIG. 2 is a block diagram illustrating the display apparatus 1 of FIG. 1. FIG. 3 is a circuit diagram of a pixel included in the display apparatus 1 of FIG. 1.

Referring to FIG. 1, according to an embodiment, the display apparatus 1 may include a display area DA and a non-display area NDA. According to an embodiment, the display apparatus 1 may be divided into a display area DA and a non-display area NDA. The display area DA is an area displaying an image, and may be referred to as a display unit. The display area DA may include a plurality of pixels P to display an image, and each pixel may include a plurality of sub-pixels emitting light of different colors, and each sub-pixel may include a transistor used for driving, a capacitor, a light-emission area or the like. Hereinafter, each sub-pixel will be described as a pixel for convenience of description.

Referring to FIG. 2, the display apparatus 1 may include a display unit 10, a scan driver 20, a data driver 30, and a processor 40. The display unit 10 may be arranged on the display area DA of FIG. 1, and the scan driver 20, the data driver 30, and the processor 40 may be arranged on the non-display area NDA.

The display unit 10 may include scan lines S via which a scan signal is transmitted, data lines D through which a data signal is transmitted in response to a scan signal from the scan lines S, and a plurality of pixels P corresponding to the data lines D and the scan lines S. According to an embodiment, the plurality of pixels P may be defined by the data lines D and the scan lines S. The scan lines S and the data lines D respectively receive signals from the scan driver 20 and the data driver 30 arranged in the non-display area NDA, and thus, may extend to the non-display area NDA.

While the scan lines S extend in a first direction X and the data lines D extend in a second direction Y crossing the first direction X in FIG. 2, the disclosure is not limited thereto. That is, directions in which the data lines D and the scan lines S extend may be exchanged.

Referring to FIG. 3, each pixel P may include a light-emitting portion L and a pixel circuit C for supplying a current to the light-emitting portion L.

A first electrode of the light-emitting portion L is connected to the pixel circuit C, and a second electrode of the light-emitting portion L is connected to a second power source VSS. The first electrode may be referred to as a pixel electrode, and the second electrode may be referred to as an opposite electrode or a common electrode. The light-emitting portion L generates light of a certain brightness in accordance with a current supplied from the pixel circuit C.

The pixel circuit C includes at least two transistors and at least one capacitor, and in detail, the pixel circuit C includes a switching transistor MS used to transmit a data signal, a driving transistor MD used to drive an organic light-emitting device according to a data signal, and a capacitor Cgs used to maintain a data voltage. The number of transistors and capacitors are not limited to the above, and more transistors and more capacitors may also be included as is obvious.

The driving transistor MD is connected to the light-emitting portion L to supply a current for light emission. A current amount of the driving transistor MD may be controlled based on a data signal applied via the switching transistor MS. The capacitor Cgs is used to maintain an applied voltage for a certain period, and is connected between a source and a gate of the driving transistor MD.

Each pixel P may be controlled based on an amount of a current that is supplied from a first power source VDD to a second power source VSS and passes the light-emitting portion L in the meantime, in accordance with a data signal. Then light of a certain brightness is emitted in a light-emission area.

The scan driver 20 applies a scan signal to the scan lines S, and may act as a switch such that a data signal applied via the data lines D according to the scan signal is applied to the driving transistor MD in each pixel P.

The processor 40 may generate RGB image data, which is digital image data based on an image signal received from the outside or by itself.

The data driver 30 may generate a data signal corresponding to RGB image data provided by the processor 40 and apply the data signal to the data lines D. According to an embodiment, the data driver 30 may include a latch circuit, a level shifter circuit, or the like. A latch circuit may store RGB image data that is serially received and store the RGB data to apply a data signal to the display unit 10 in parallel. A latch shifter circuit may adjust a level of an actual voltage applied to the display unit 10. Detailed structures of a latch circuit and a level shifter circuit are obvious to one of ordinary skill in the art, and thus detailed description thereof will be omitted.

Figure 4:
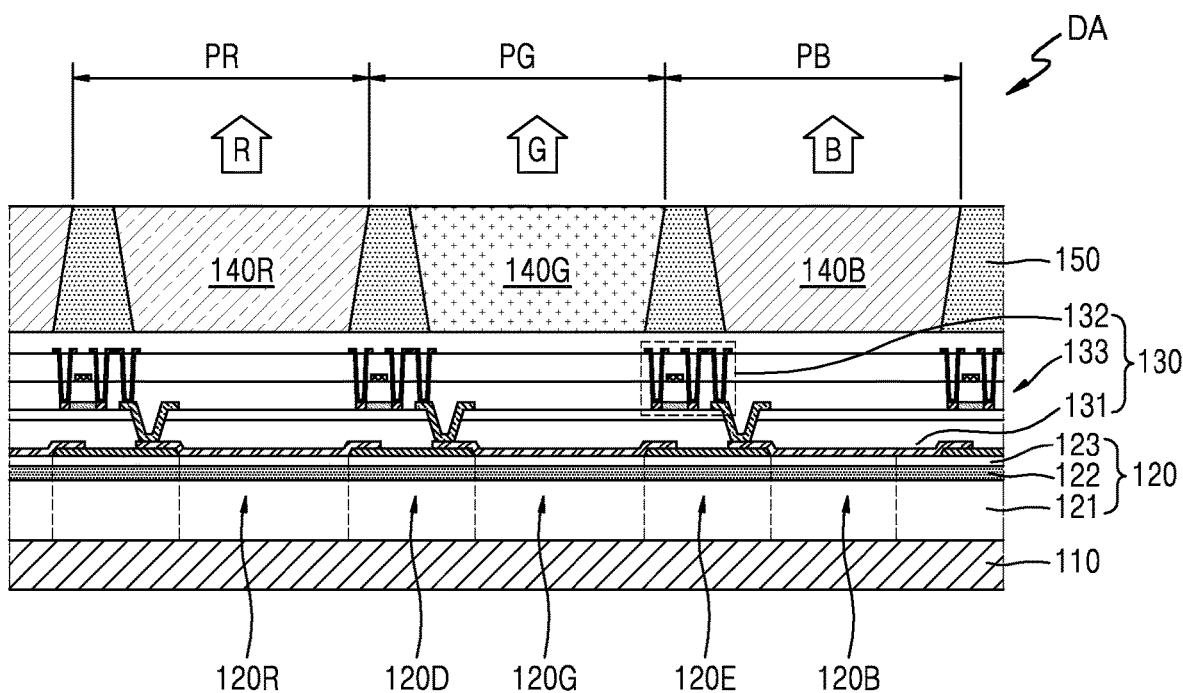
FIG. 4 is a cross-sectional view of a portion of a display area of a display apparatus according to an embodiment.

FIG. 4 is a cross-sectional view of a portion of the display unit 10 of the display apparatus 1 according to an embodiment. Referring to FIG. 4, the display apparatus 1 may include a plurality of pixels PR, PG, and PB, and the pixels PR, PG, and PB may include a first pixel PR emitting red light, a second pixel PG emitting green light, and a third pixel PB emitting blue light.

The display apparatus 1 may include a substrate 110, an emissive layer 120 arranged on the substrate 110, and a driving layer 130 arranged on the emissive layer 120 and including a plurality of driving elements 132, and a plurality of color conversion layers 140R, 140G, and 140B arranged on the driving layer 130.

The substrate 110 may include a substrate used to grow the emissive layer 120. The substrate 110 may include various materials used in general semiconductor processes. For example, a silicon substrate or a sapphire substrate may be used as the substrate 110. However, this is merely an example, and other various materials may also be used as the substrate 110.

The emissive layer 120 emitting light is arranged on an upper surface of the substrate 110. The emissive layer 120 may include a plurality of light-emission areas respectively corresponding to a plurality of pixels, and the plurality of light-emission areas may be connected to each other via portions of the emissive layer 120. For example, the emissive layer 120 may include a first light-emission area 120R corresponding to the first pixel PR, a second light-emission area 120G corresponding to the second pixel PG, and a third light-emission area 120B corresponding to the third pixel PB. The first light-emission area 120R may be connected to the second light-emission area 120G via a first dummy area 120D of the emissive layer 120, and the second light-emission area 120G may be connected to the third light-emission area 120B via a second dummy area 120E of the emissive layer 120. According to an embodiment, the first light-emission area 120R, the second light-emission area 120G and the third light-emission area 120B are defined by a first electrode 131 which will be described later, According to an embodiment, the first light-emission area 120R, the second light-emission area 120G and the third light-emission area 120B and the first and second dummy areas 120D and 120E may be formed of substantially identical materials.

The emissive layer 120 may be a light-emitting diode (LED) layer based on an inorganic material. The emissive layer 120 may emit, for example, blue light. However, the emissive layer 120 is not limited thereto. The emissive layer 120 may emit light of a certain wavelength based on a material included in the emissive layer 120. The emissive layer 120 may be formed by sequentially forming a first semiconductor layer 121, an active layer 122, and a second semiconductor layer 123 on the upper surface of the substrate 110.

The first semiconductor layer 121 may be arranged on the upper surface of the substrate 110. The first semiconductor layer 121 may include, for example, an n-type semiconductor. However, the first semiconductor layer 121 is not limited thereto, and may include a p-type semiconductor according to circumstances. The first semiconductor layer 121 may include a Group III-V n-type semiconductor such as n-GaN. The first semiconductor layer 121 may have a single-layer or multi-layer structure.

The active layer 122 may be arranged on an upper surface of the first semiconductor layer 121. The active layer 122 may emit light as electrons and holes combine with each other. The active layer 122 may have a multi-quantum well (MQW) structure. The active layer 122, however, is not limited thereto, and may also have a single-quantum well (SQW) structure. The active layer 122 may include a Group III-V semiconductor, for example, GaN. Meanwhile, while the active layer 122 formed as a two-dimensional thin film is illustrated as an example, the active layer 122 is not limited thereto and may also have a three-dimensional shape such as a rod shape or a pyramid structure through growth by using a mask.

The second semiconductor layer 123 may be arranged on an upper surface of the active layer 122. The second semiconductor layer 123 may include, for example, a p-type semiconductor. However, the second semiconductor layer 123 is not limited thereto and may include an n-type semiconductor according to circumstances. The second semiconductor layer 123 may include a Group III-V p-type semiconductor such as p-GaN. The second semiconductor layer 123 may have a single-layer or multi-layer structure.

The driving layer 130 arranged on the emissive layer 120 may include a driving element 132 used to emit light from the emissive layer 120. The driving layer 130 may include an electrode pair (for example, the first electrode 131 and a second electrode) that is in contact with the emissive layer 120, a plurality of driving elements 132 connected to the electrode pair, and a gate line, a data line D, etc. connected to the driving elements 132.

The number of first electrodes 131 may be equal to that of pixels. The first electrode 131 may be referred to as a pixel electrode. A plurality of first electrodes 131 may spaced apart from each other on portions of the emissive layer 120 to respectively correspond to a plurality of color conversion layers 140R, 140G, and 140B. Each of the first electrodes 131 may be in contact with the emissive layer 120, for example, with the second semiconductor layer 123, and may extend to an upper surface of an insulating layer that is in contact with the second semiconductor layer 123.

As each of the first electrodes 131 is in contact with the emissive layer 120 through holes, an area of contact between the first electrodes 131 and the second semiconductor layer 123 may be limited. Thus, a current supplied from the first electrodes 131 to the second semiconductor layer 123 may be limited to the holes. Accordingly, light may be generated mainly from an area of the active layer 122 below the color conversion layers 140R, 140B, and 140B of certain colors. The light may only be incident to the color conversion layers 140R, 140B, and 140B of certain colors, to which the light corresponds, and is less likely to proceed to other pixels nearby. According to an embodiment, even when the light travels in another direction than toward the holes, the light is totally internally reflected by one or more insulating layers 133 having a refractive index that is less than the emissive layer 120, and thus, light generated in a certain pixel is not emitted through other pixels and degradation in a color quality may be reduced accordingly.

The plurality of first electrodes 131 may be arranged to respectively correspond to the plurality of pixels PR, PG, and PB, that is, the plurality of color conversion layers 140R, 140B, and 140B in a one-to-one correspondence. For example, the first electrodes 131 may be respectively arranged below a first color conversion layer 140R, a second color conversion layer 140G, and a third color conversion layer 140B.

The first electrodes 131 may include a transparent conductive material. For example, the first electrodes 131 may include indium tin oxide (ITO), ZnO, indium zinc oxide (IZO), Ag, Au, Ni, graphene, or nanowire. However, the first electrode 131 is not limited thereto. In the above-described manner, when light generated in the emissive layer 120 is incident, through the first electrodes 131, to the color conversion layers 140R, 140B, and 140B of colors to which the light corresponds, light loss may be reduced.

Each of the plurality of first electrodes 131 may also be electrically connected also to each of the plurality of driving elements 132 in a one-to-one correspondence. The driving elements 132 selectively drive at least one desired pixel from among the pixels PR, PG, and PB. While transistors are illustrated as the driving elements 132 in the drawings, the driving elements 132 are not limited thereto. The driving elements 132 may include two or more transistors and one or more capacitors.

According to an embodiment, the driving layer 130 may include a plurality of insulating layers 133. The plurality of insulating layers 133 may prevent leakage of a current among pixels and leakage of a current between conductive materials constituting the driving elements 132. In addition, the insulating layers 133 may also totally internally reflect light that is incident at an angle greater than a critical angle in the emissive layer 120. The insulating layers 133 may include $SiO_2$, SiN, $Al_2O_3$ or $TiO_2$, or the like, but are not limited thereto.

The plurality of color conversion layers 140R, 140B, and 140B that convert light generated in the active layer 122 of the emissive layer 120 to light of a certain color to emit the light are arranged on the driving layer 130. Each of the plurality of the color conversion layers 140R, 140B, and 140B may be arranged on portions of the emissive layer 120. Accordingly, the plurality of the color conversion layers 140R, 140B, and 140B may share one emissive layer 120. The plurality of the color conversion layers 140R, 140B, and 140B may be formed using a photolithography method or the like.

For example, the plurality of the color conversion layers 140R, 140B, and 140B may include the first color conversion layer 140R, the second color conversion layer 140G, and the third color conversion layer 140B. Thus, the first color conversion layer 140R and portions of the emissive layer 120 and the driving layer 130 under the first color conversion layer 140R may be a component of a red pixel PR, and the second color conversion layer 140G and portions of the emissive layer 120 and the driving layer 130 under the second color conversion layer 140G may be a component of a green pixel PG, and the third color conversion layer 140B and portions of the emissive layer 120 and the driving layer 130 under the third color conversion layer 140B may be a component of a blue pixel PB.

The first color conversion layer 140R may convert light generated in the active layer 122 to red light R and emit the same. Light generated in the active layer 122 may be blue light. The first color conversion layer 140R may include quantum dots (QDs) that have a certain size and are excited by blue light to emit red light R. The QDs may have a core-shell structure having a core portion and a shell portion, or a shell-less particle structure. A core-shell structure may have a single-shell or a multi-shell. The multi-shell may be, for example, a double-shell.

The QDs may include at least one of, for example, Group II-VI semiconductor quantum dots, Group III-V semiconductor quantum dots, Group IV-VI semiconductor quantum dots, Group IV semiconductor quantum dots, and graphene quantum dots. In detail, the QDs may include at least one of Cd, Se, Zn, S, and InP, but are not limited thereto. Each quantum dot may have a diameter of tens of nm or less, for example, a diameter of 10 nm or less. In addition, the first color conversion layer 140R may include a phosphor that emits red light R by being excited by blue light generated in the active layer 122. The first color conversion layer 140R may further include a photoresist having high transmitting characteristics or a light scattering agent that uniformly emits red light R.

The second color conversion layer 140G may convert light generated in the active layer 122 to green light G and emit the same. The active layer 122 may generate blue light B. The second color conversion layer 140G may include QDs that have a certain size and are excited by blue light B to emit green light G. In addition, the second color conversion layer 140G may include a phosphor that emits green light G by being excited by blue light B generated in the active layer 122. The second color conversion layer 140G may include a photoresist or a light scattering agent.

The third color conversion layer 140B may convert light generated in the active layer 122 to blue light B and emit the same. When blue light B is generated in the active layer 122, the third color conversion layer 140B may include a transmissive layer through which the blue light B generated in the active layer 122 is transmitted without wavelength conversion. When the third color conversion layer 140B is a transmissive layer, the third color conversion layer 140B may include no QDs and may include a photoresist or a light scattering agent such as $TiO_2$.

Meanwhile, the display apparatus 1 may further include one or more barriers 150 that spatially separate the plurality of the color conversion layers 140R, 140B, and 140B apart from each other. For example, the barriers 150 may be disposed between the first color conversion layer 140R and the second color conversion layer 140G, between the second color conversion layer 140G and the third color conversion layer 140B, and between the third color conversion layer 140B and the first color conversion layer 140R. The barriers 150 may have a tapered shape with a width decreasing from a lower portion to an upper portion thereof. The barriers 150 having the tapered shape may increase an aperture ratio of pixels. The barriers 150 may prevent color mixture among lights emitted from the first through third color conversion layers 140R, 140B, and 140B to thereby increase contrast. The barriers 150 may include at least one of a black matrix material, a resin, and a polymer.

In the above-described structure, when, for example, a thin film transistor corresponding to the first pixel PR is driven and a certain voltage is applied between a second electrode, which is a common electrode, and the first electrode 131 corresponding to the first pixel PR, light is generated in a portion of the active layer 122 located below the first color conversion layer 140R. When the light is incident on the first color conversion layer 140R, the first color conversion layer 140R may convert the light to red light R and emit the same.

Moreover, when the driving element 132 corresponding to the second pixel PG is driven to apply a certain voltage between the second electrode, which is a common electrode, and the first electrode 131 corresponding to the second pixel PG, light is generated in a portion of the active layer 122 located below the second color conversion layer 140G. As the light is incident on the second color conversion layer 140G, the second color conversion layer 140G may emit green light G to the outside.

Furthermore, when the driving element 132 corresponding to the third pixel PB is driven to apply a certain voltage between the second electrode, which is a common electrode, and the first electrode 131 corresponding to the third pixel PB, light is generated in a portion of the active layer 122 located below the third color conversion layer 140B. The light may be transmitted through the third color conversion layer 140B to be emitted to the outside.

According to the embodiment, the display apparatus 1 having a high resolution and an increased light efficiency may be implemented. Small-sized LED chips corresponding to the pixels PR, PG, and PB are to be individually manufactured to implement the display apparatus 1 having a high resolution according to the related art, and transferring the small-sized LED chips at appropriate locations is required. In this case, the active layers 122, which are a light-emission area, are separated from each other for each pixel, thus increasing an exposure area of the active layers 122 and reducing light efficiency. In addition, it is difficult to transfer the small-sized LED chips at accurate positions.

According to an embodiment, the display apparatus 1 may be easily manufactured without a transfer operation as a plurality of pixels PR, PG, and PB are arranged on one emissive layer 120. For example, the plurality of pixels PR, PG, and PB may be arranged on one active layer 122 without a transfer operation. In addition, as the active layer 122, which is a light-emission area, is not exposed in each pixel, light efficiency may be increased. As described above, sequentially stacking the emissive layer 120, the driving layer 130, the barrier 150, and the first through third color conversion layers 140R, 140B, and 140B on the substrate 110 may be referred to as monolithic formation.

As described above, a pixel may be formed by combining the emissive layer 120, the driving layer 130, and the first through third color conversion layers 140R, 140B, and 140B. A pixel is not completed just with the emissive layer 120 and the driving layer 130, without the first through third color conversion layers 140R, 140B, and 140B, and thus, a layer formed of only the emissive layer 120 and the driving layer 130 may be referred to as a pre-pixel. For example, portions of the emissive layer 120 and the driving layer 130 located under the first color conversion layer 140R may be referred to as a first pre-pixel PPR; portions of the emissive layer 120 and the driving layer 130 located under the second color conversion layer 140G may be referred to as a second pre-pixel PPG; and portions of the emissive layer 120 and the driving layer 130 located under the third color conversion layer 140B may be referred to as a third pre-pixel PPB (see FIG. 6A).

Meanwhile, in the display apparatus 1 having a pixel size of 500 ppi (pixels per inch) or more, due to the very small pixel size, it is difficult to pattern the first through third color conversion layers 140R, 140B, and 140B by using a mask. Hereinafter, a method of manufacturing the display apparatus 1 by patterning the first through third color conversion layers 140R, 140B, and 140B by using exposure of a light-emission region itself will be described.

Figure 5:
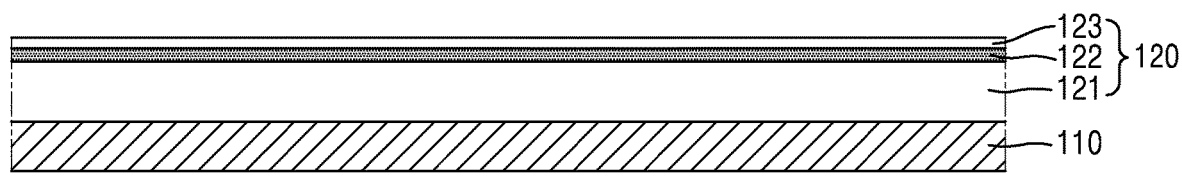
FIG. 5 is a reference diagram for describing a method of forming an emissive layer, according to an embodiment.

FIGS. 5 through 14 are reference diagrams regarding a method of manufacturing the display apparatus 1. As illustrated in FIG. 5, an emissive layer 120 may be formed on a portion of a substrate 110. The substrate 110 may be used to grow the emissive layer 120. The substrate 110 may include various materials used in general semiconductor processes. For example, a silicon substrate or a sapphire substrate may be used as the substrate 110. However, this is merely an example, and other various materials may also be used as the substrate 110. The emissive layer 120 may include an LED layer based on an inorganic material. The emissive layer 120 may emit, for example, blue light. However, the emissive layer 120 is not limited thereto. The emissive layer 120 may emit light of a certain wavelength based on a material included in the emissive layer 120.

The emissive layer 120 may be formed by sequentially forming a first semiconductor layer 121, an active layer 122, and a second semiconductor layer 123 on an upper surface of the substrate 110. The first semiconductor layer 121 may be arranged on the upper surface of the substrate 110. The first semiconductor layer 121 may include, for example, an n-type semiconductor. The active layer 122 may be arranged on an upper surface of the first semiconductor layer 121. The active layer 122 may emit light as electrons and holes combine with each other. The active layer 122 may have an MQW structure. The active layer 122, however, is not limited thereto, and may also have an SQW structure according to another embodiment. The second semiconductor layer 123 may be arranged on an upper surface of the active layer 122. The second semiconductor layer 123 may include, for example, a p-type semiconductor. A surface area of the emissive layer 120 may be greater than a pixel size. The emissive layer 120 may be formed on the entire display area DA of the substrate 110.

Figure 6A:
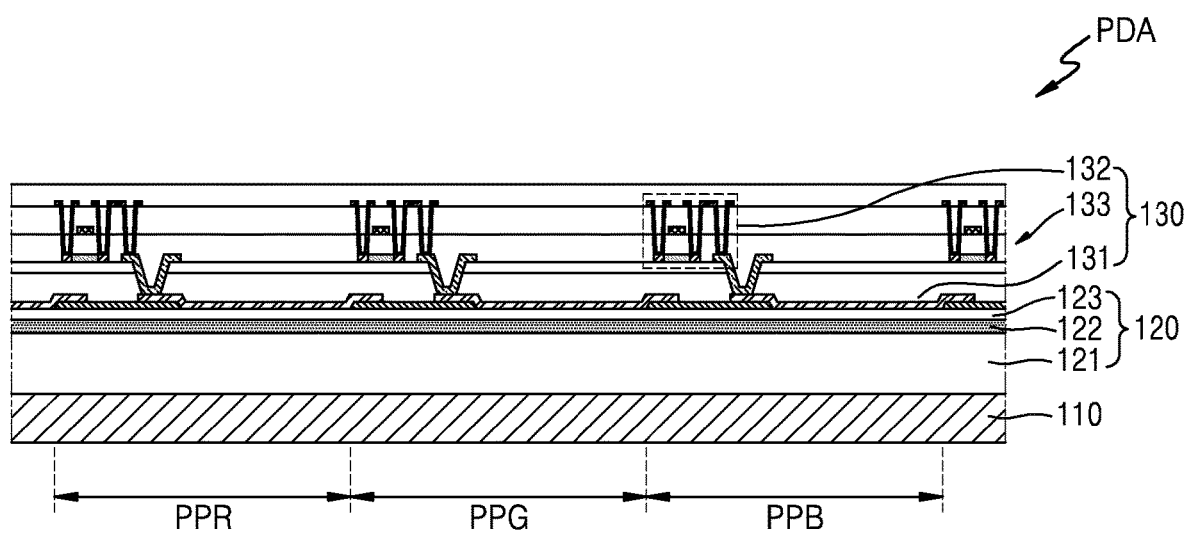
FIGS. 6A and 6B are reference diagrams for describing a method of forming a driving layer, according to an embodiment.

As illustrated in FIG. 6A, a driving layer 130 may be formed on the emissive layer 120. The driving layer 130 may include an electrode pair (for example, the first electrode 131 and a second electrode that is in contact with the emissive layer 120, a plurality of driving elements 132 connected to the electrode pair, a scan line, a data line, etc. connected to the driving elements 132. The number of first electrodes 131 may be equal to a number of pixels. The first electrodes 131 may be referred to as pixel electrodes. A plurality of first electrodes 131 may be arranged to respectively correspond to the plurality of pixels PR, PG, and PB in a one-to-one correspondence. The driving layer 130 may also include a plurality of driving elements 132 respectively corresponding to the plurality of pixels PR, PG, and PB in a one-to-one correspondence and may include one or more insulating layers 133 preventing leakage of a current between the electrode pair and the driving elements 132. According to an embodiment, the one or more insulating layer 133 may include a plurality of insulating layers.

A pixel is not completed not just with the emissive layer 120 and the driving layer 130 illustrated in FIG. 6A. Thus, portions of the emissive layer 120 and the driving layer 130, on which a first color conversion layer 140R is to be formed, may be referred to as a first pre-pixel PPR; portions of the emissive layer 120 and the driving layer 130, on which a second color conversion layer 140G is to be formed, may be referred to as a second pre-pixel PPG; and portions of the emissive layer 120 and the driving layer 130, on which a third color conversion layer 140B is to be formed, may be referred to as a third pre-pixel PPB. In addition, an area where the first through third pre-pixels PPR, PPG, and PPR are present is referred to as a pre-display area PDA.

Figure 6B:
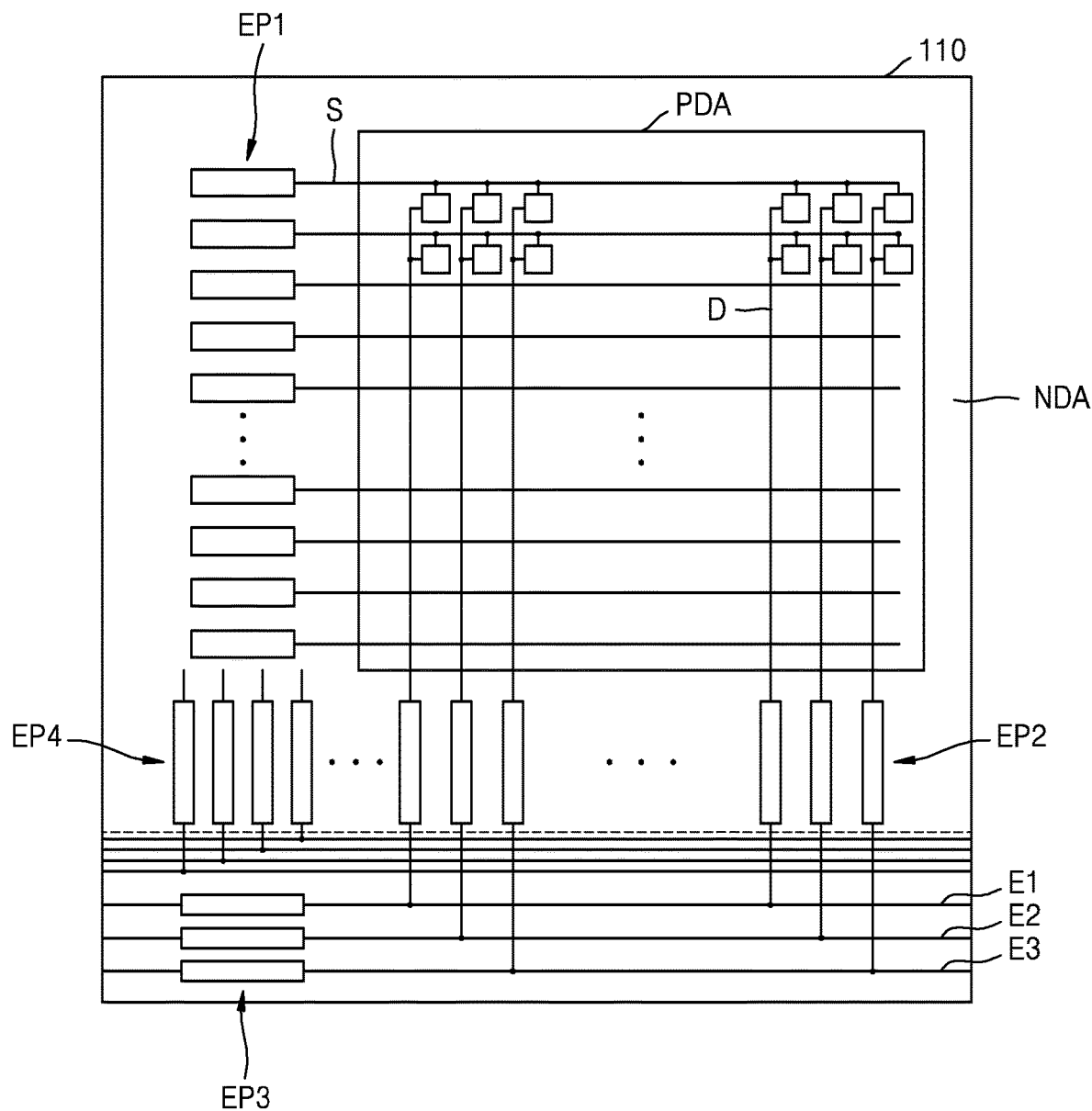

According to an embodiment, the driving layer 130 may include, as illustrated in FIG. 6B, scan lines S that are respectively electrically connected to the plurality of driving elements 132 to transmit a scan signal and data lines D that are respectively electrically connected to the driving elements 132 to transmit a data signal in response to a scan signal. The scan lines S and the data lines D may be formed not only in the pre-display area PDA but may also extend to a non-display area NDA. In addition, in the non-display area NDA, first electrode pads EP1 having a first end contacting the scan lines S may be formed, and second electrode pads EP2 having a first end contacting the data lines D may be formed. The first electrode pads EP1 may be contacted by a scan driver 20, and the second electrode pads EP2 may be contacted by a data driver 30.

Meanwhile, the second electrode pads EP2 may be formed to overlap the data lines D, and the data lines D may extend beyond the second electrode pads EP2. The data lines D and the second electrode pads EP2 may be formed of a same material and may be formed as a single unit.

In addition, in the non-display area NDA of the substrate 110, exposure lines E1, E2, and E3 connected to the data lines D may be formed. The exposure lines E1, E2, and E3 refer to lines to which a signal used to form the first through third color conversion layers 140R, 140B, and 140B is applied. The exposure lines E1, E2, and E3 may be formed of a conductive material. For example, the exposure lines E1, E2, and E3 may also be formed of a material identical to a material used to form the scan line S or the data line D.

For example, the exposure lines E1, E2, and E3 may include a first exposure line E1 used to form the first color conversion layer 140R, a second exposure line E2 used to form the second color conversion layer 140G, and a third exposure line E3 used to form the third color conversion layer 140B. The first through third exposure lines E1, E2, and E3 may be arranged in a direction crossing a data line D, for example, in a first direction, and may not be electrically connected to each other.

The first exposure line E1 may be connected to data lines D connected to a pre-pixel, which is to be a pixel emitting red light, that is, first pre-pixels PPR, from among the data lines D. The second exposure line E2 may be connected to data lines D connected to a pre-pixel, which is to be a pixel emitting green light, that is, second pre-pixels PPG, from among the data lines D. The third exposure line E3 may be connected to data lines D connected to a pre-pixel, which is to be a pixel emitting blue light, that is, third pre-pixels PPB, from among the data lines D.

Electrical connection between first through third exposure lines E1, E2, and E3 and the data lines D may be determined based on a pixel type of the display apparatus 1. For example, when a display is a pixel type in which RGB colors are sequentially repeated and 3m data lines D are included (m being an integer), the first exposure line E1 may be electrically connected to first, fourth, . . . , 3k+1(th), . . . , 3m−2(th) data lines D, the second exposure line E2 may be electrically connected to second, fifth, . . . , 3k+2(th), . . . , and 3m−1(th) data lines D, and the third exposure line E3 may be electrically connected to third, sixth, 3k+3(th), . . . , and 3m(th) data lines D.

Third electrode pads EP3 may be arranged on each of the first through third exposure lines E1, E2, and E3, and fourth electrode pads EP4 and conducive lines overlapping the fourth electrode pads EP4 may be arranged in the non-display area NDA. The third electrode pads EP3 may be contacted by an exposure controlling apparatus, and the fourth electrode pads EP4 may be contacted by an exposure controlling apparatus or a processor.

Figure 7A:
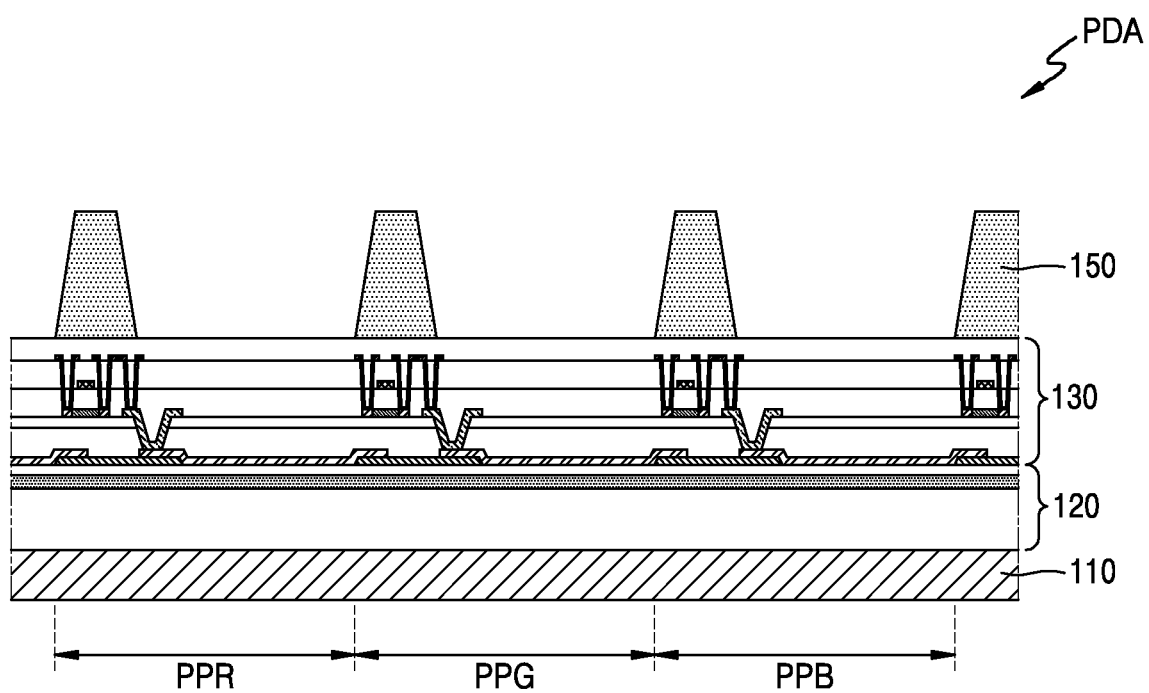
FIG. 7A is a reference diagram for describing a method of forming a barrier, according to an embodiment.

In addition, as illustrated in FIG. 7A, a barrier 150 defining a pixel size may be formed on the display area DA of the substrate 110. The barrier 150 may have a tapered shape with a width decreasing from a lower portion to an upper portion thereof. The barrier 150 may include at least one of a black matrix material, a resin, and a polymer.

Figure 7B:
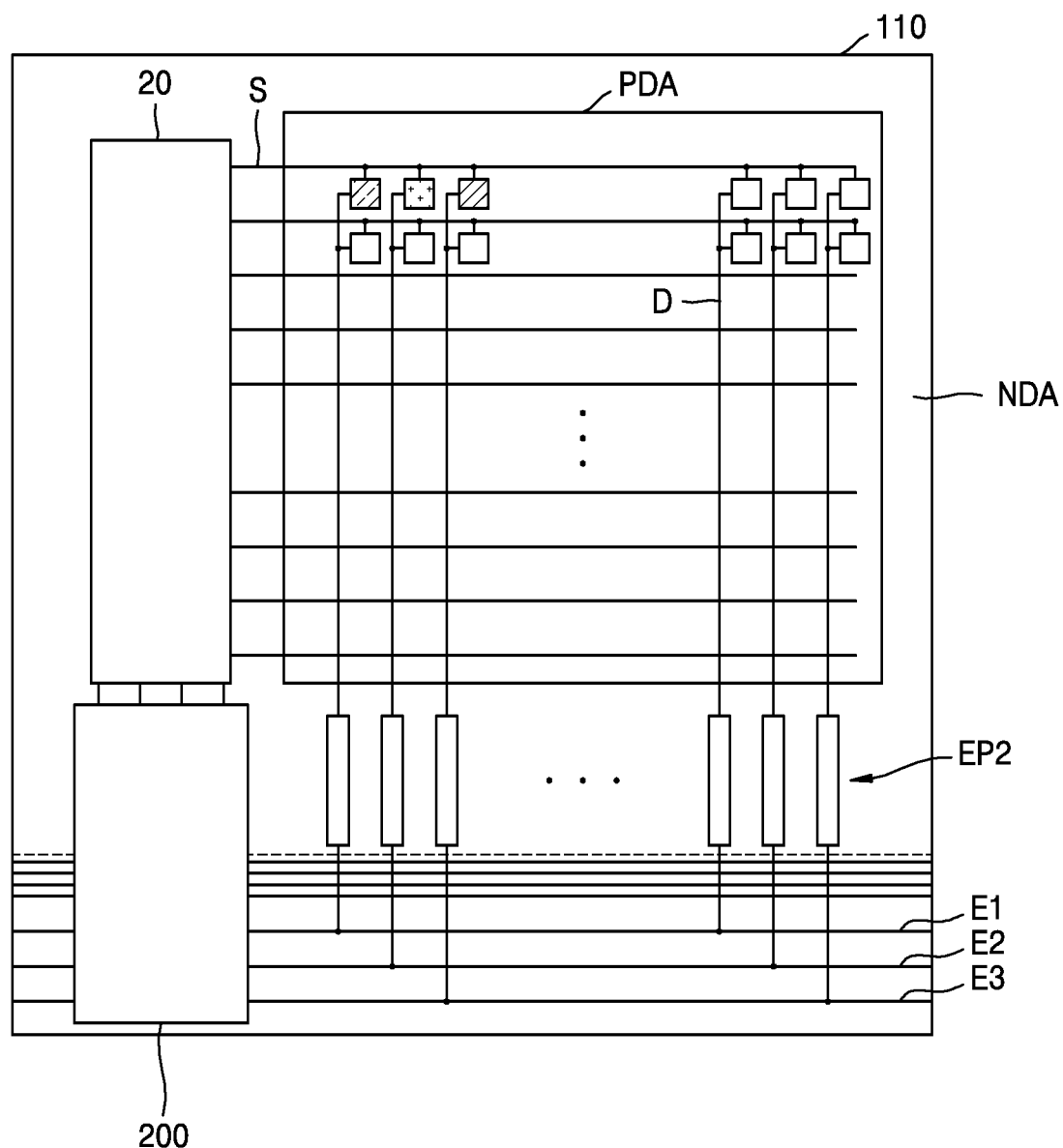
FIG. 7B is a reference diagram illustrating a method of mounting a scan driver and an exposure controlling apparatus, according to an embodiment.

Then, as illustrated in FIG. 7B, a scan driver 20 and an exposure controlling apparatus 200 may be mounted in the non-display area NDA of the substrate 110. The scan driver 20 may be arranged adjacent to the first electrode pads EP1. The scan driver 20 may also be in contact with conductive lines overlapping the fourth electrode pads EP4.

The exposure controlling apparatus 200 may be arranged to be in contact with the third electrode pads EP3 and the fourth electrode pads EP4. Thus, the exposure controlling apparatus 200 may electrically connect the scan driver 20 to the first, second, and third exposure lines E1, E2, and E3. The exposure controlling apparatus 200 applies an electrical signal to the scan driver 20 and the exposure lines E1, E2, and E3 such that light is emitted from a particular area of the emissive layer 120, that is, the first, second, and third pre-pixels PPR, PPG, and PPB. The emitted light may be used to form the first through third color conversion layers 140R, 140B, and 140B.

Figure 8A:
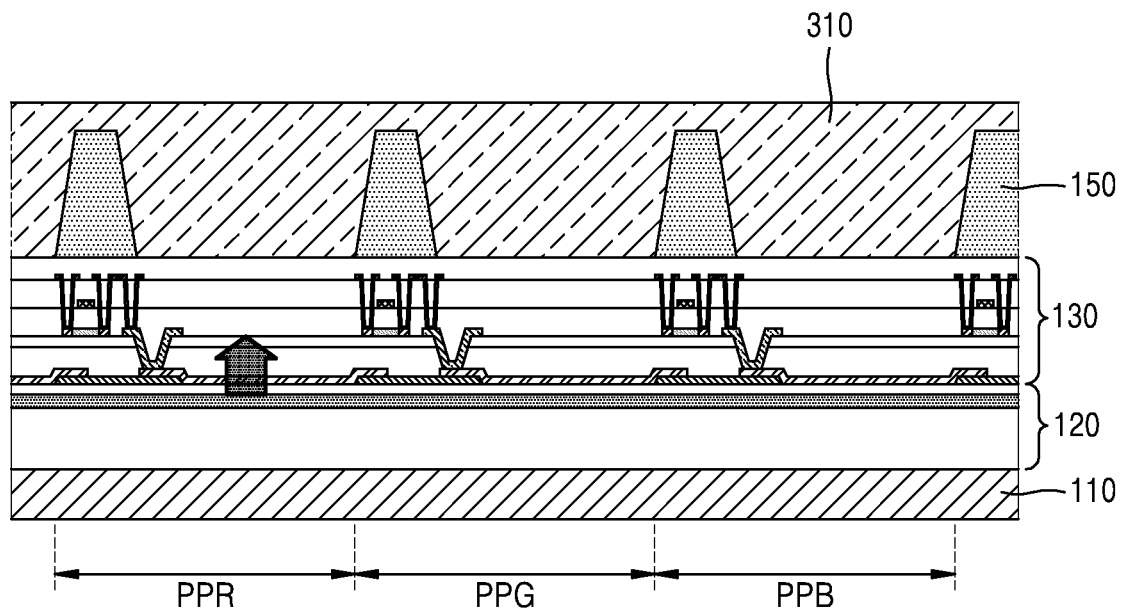
FIGS. 8A, 8B, and 9 are reference diagrams for describing a method of forming a first color conversion layer, according to an embodiment.

Next, a method of forming the first through third color conversion layers 140R, 140B, and 140B by using the exposure lines E1, E2, and E3 will be described according to an embodiment. As illustrated in FIG. 8A, a first color conversion material 310 may be formed on the driving layer 130. The first color conversion material 310 may be formed on an entire portion of the driving layer 130. According to an embodiment, the first color conversion material 310 may be formed only a first pre-pixel PPR. As a method of forming the first color conversion material 310, spin coating or a spray method or the like may be applied.

Figure 8B:
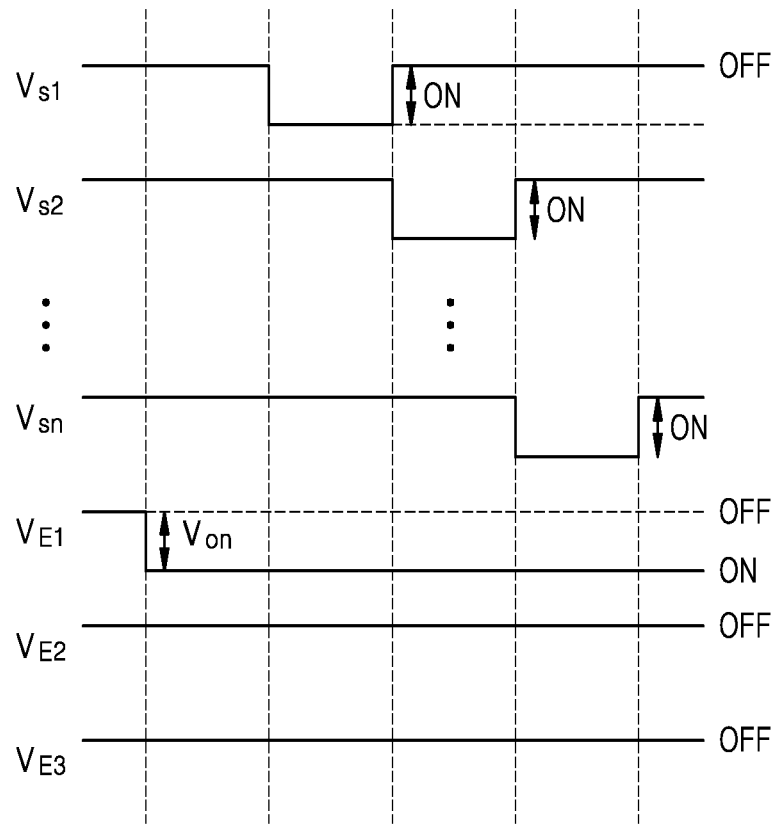

In addition, as illustrated in FIG. 8B, the exposure controlling apparatus 200 may apply a scan control signal to the scan driver 20, an on signal Von to the first exposure line E1 ($V_{E1}$), and an off signal Voff to the second and third exposure lines E2 and E3 ($V_{E2}$ and $V_{E3}$). Then the scan driver 20 may respectively and sequentially apply scan signals Vs1, Vs2, . . . , Vsn to scan lines according to a scan control signal. Then, as illustrated in FIG. 8A, light is emitted from a light-emission area of the emissive layer 120, which is electrically connected to the first exposure line E1 and a scan line, to which a scan signal is applied. The first color conversion material 310 arranged above the area from which light is emitted may be hardened into the first color conversion layer 140R.

Figure 9:
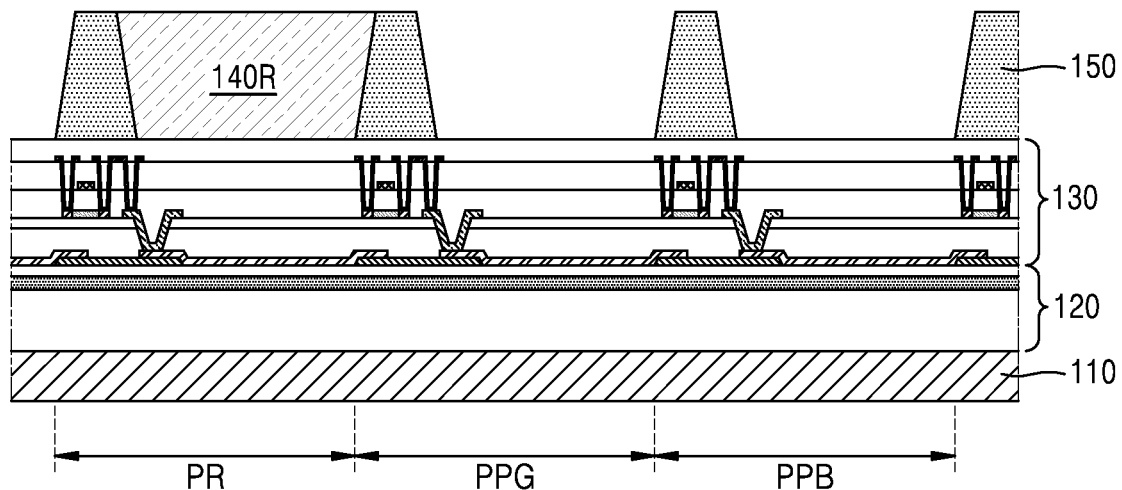

As illustrated in FIG. 9, the first color conversion material 310 that is not hardened may be removed from the substrate 110. The first color conversion material 310 that is not hardened may be removed from the substrate 110 by using a developing solution. The developing solution may be water. As the first color conversion material 310 that is hardened is turned into the first color conversion layer 140R, the first pixel PR may be completed. The first pixel PR may be a red pixel emitting red light.

Figure 10A:
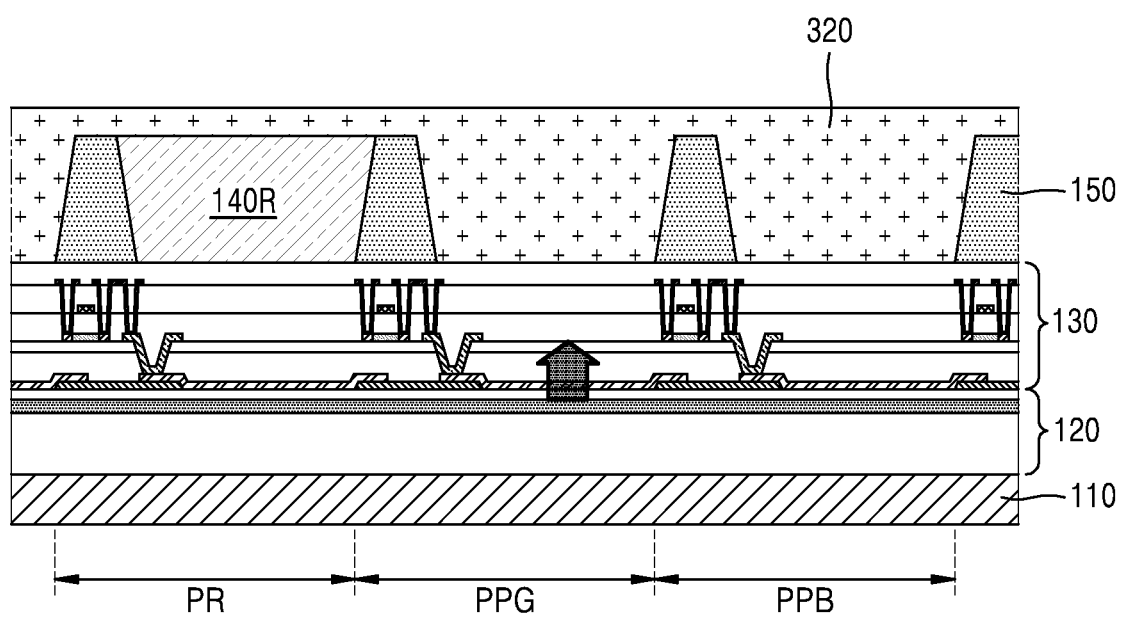
FIGS. 10A, 10B, and 11 are reference diagrams for describing a method of forming a first color conversion layer, according to an embodiment.

In addition, as illustrated in FIG. 10A, a second color conversion material 320 may be formed on the driving layer 130. According to an embodiment, the second color conversion material 320 may be formed overall on the driving layer 130. According to an embodiment, the second color conversion material 320 may be formed only on a second pre-pixel PPG. As a method of forming the second color conversion material 320, spin coating or a spray method or the like may be applied.

Figure 10B:
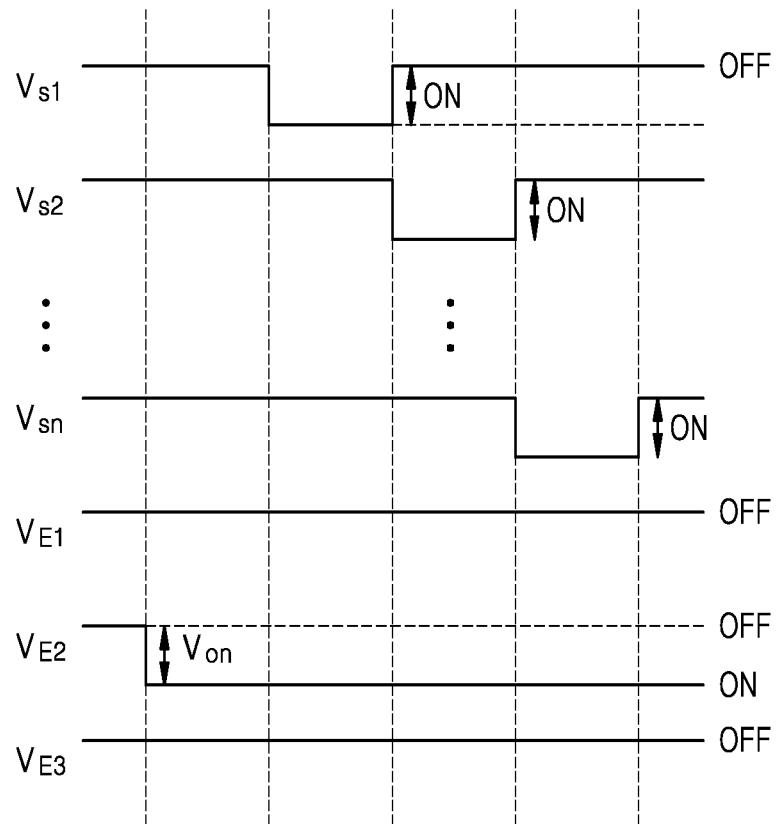

In addition, as illustrated in FIG. 10B, the exposure controlling apparatus 200 may apply a scan control signal to the scan driver 20, an on signal Von to the second exposure line E2 ($V_{E2}$), and an off signal Voff to the first and third exposure lines E1 and E3 ($V_{E1}$ and $V_{E3}$). Then, the scan driver 20 may respectively and sequentially apply scan signals Vs1, Vs2, . . . , Vsn to scan lines according to a scan control signal. Then, as illustrated in FIG. 10A, light is emitted from a light-emission area of the emissive layer 120, which is electrically connected to the second exposure line E2 and a scan line, to which a scan signal is applied. The second color conversion material 320 arranged above the area from which light is emitted may be hardened into the second color conversion layer 140G.

Figure 11:
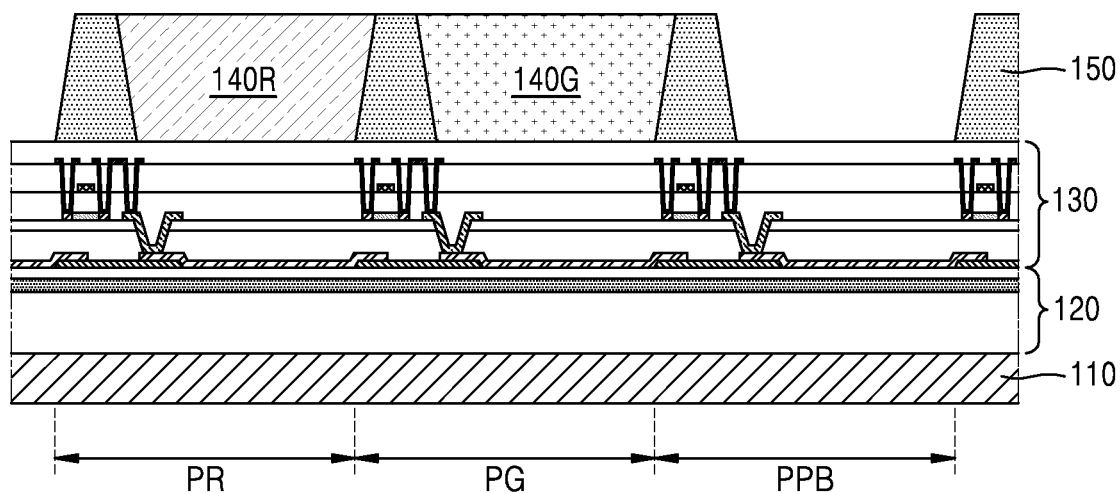

As illustrated in FIG. 11, the second color conversion material 320 that is not hardened may be removed from the substrate 110. The second color conversion material 320 that is not hardened may be removed from the substrate 110 by using a developing solution. The developing solution may be water. As the second color conversion material 320 that is hardened is turned into the second color conversion layer 140G, the second pixel PG may be completed. The second pixel PG may be a green pixel emitting green light.

Figure 12A:
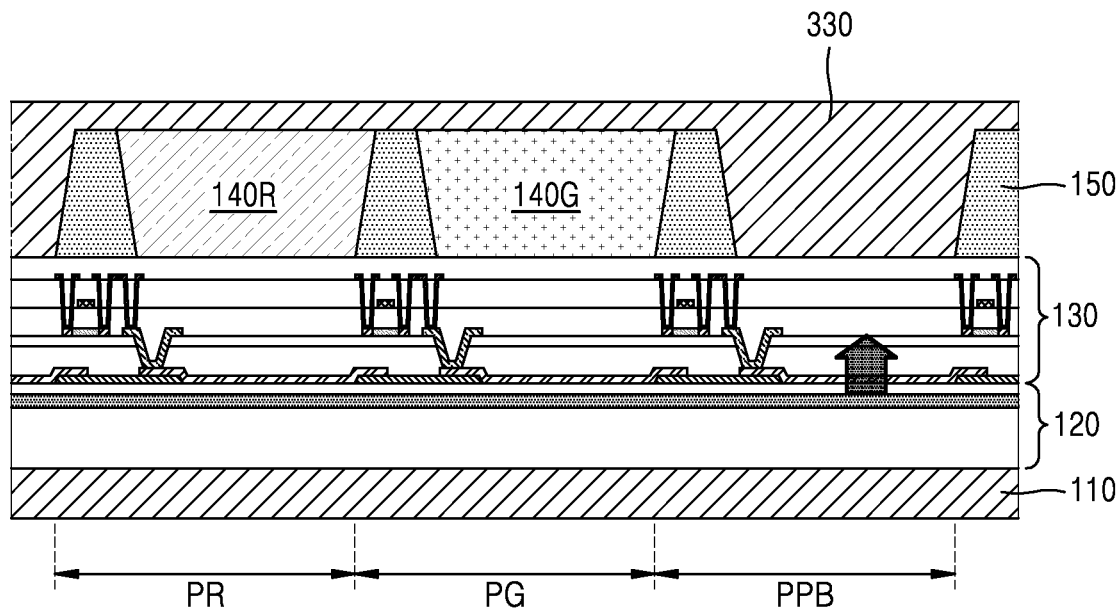
FIGS. 12A, 12B, and 13 are reference diagrams for describing a method of forming a second color conversion layer, according to an embodiment.
Figure 12B:
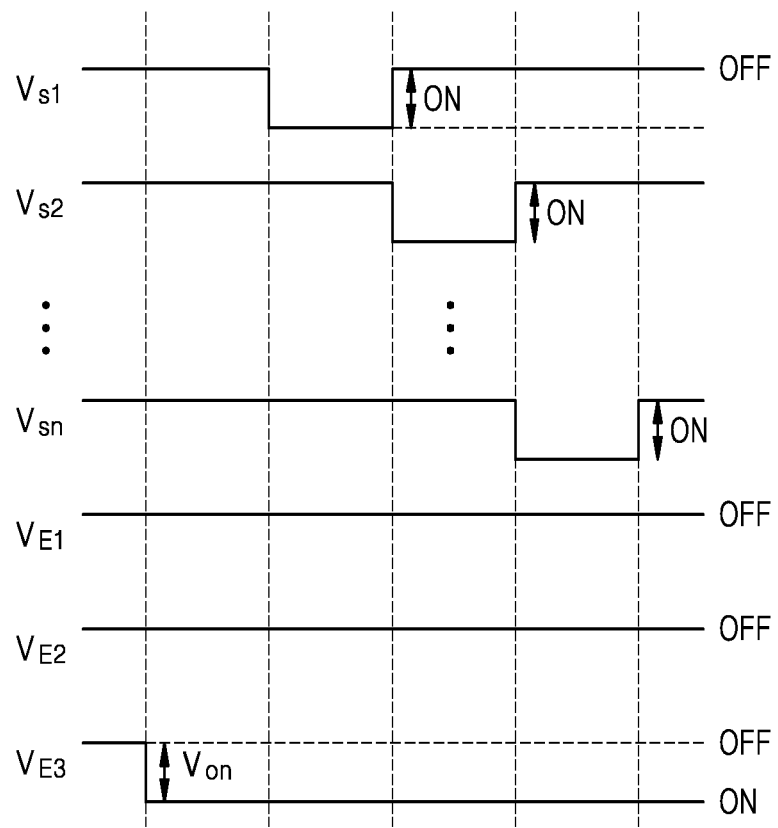

Likewise, as illustrated in FIG. 12A, the exposure controlling apparatus 200 may apply a scan control signal to the scan driver 20, an on signal Von to the third exposure line E3 ($V_{E3}$), and an off signal Voff to the first and second exposure lines E1 and E2 ($V_{E1}$ and $V_{E2}$). Then the scan driver 20 may respectively and sequentially apply scan signals Vs1, Vs2, . . . , Vsn to scan lines according to a scan control signal. Then, as illustrated in FIG. 12A, light is emitted from a light-emission area of the emissive layer 120, which is electrically connected to the third exposure line E3 and a scan line, to which a scan signal is applied. A third color conversion material 330 arranged above the area from which light is emitted may be hardened into the third color conversion layer 140B.

Figure 13:
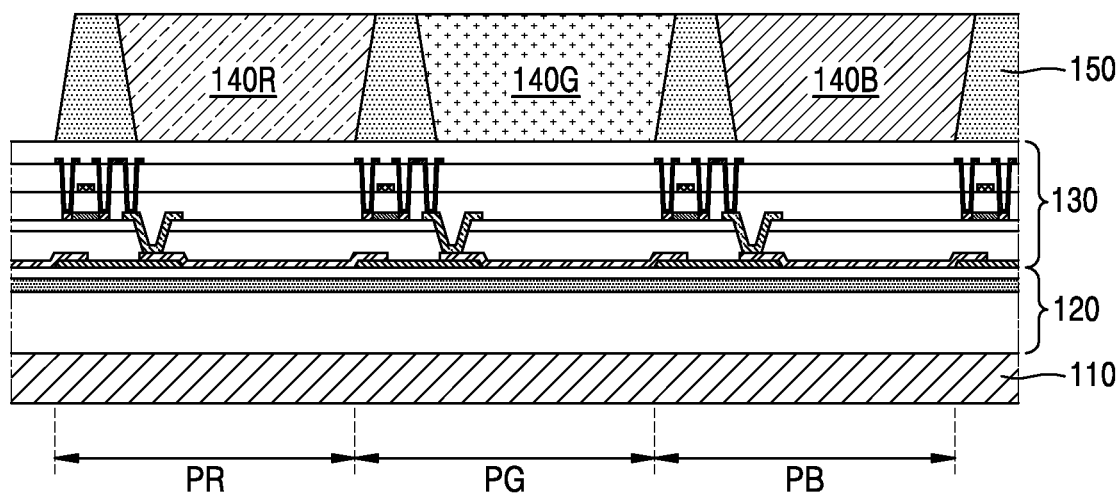

As illustrated in FIG. 13, the third color conversion material 330 that is not hardened may be removed from the substrate 110. The third color conversion material 330 that is not hardened may be removed from the substrate 110 by using a developing solution. The developing solution may be water. As the third color conversion material 330 that is hardened is turned into the third color conversion layer 140B, the third pixel PB may be completed. The third pixel PB may be a blue pixel emitting blue light.

Figure 14:
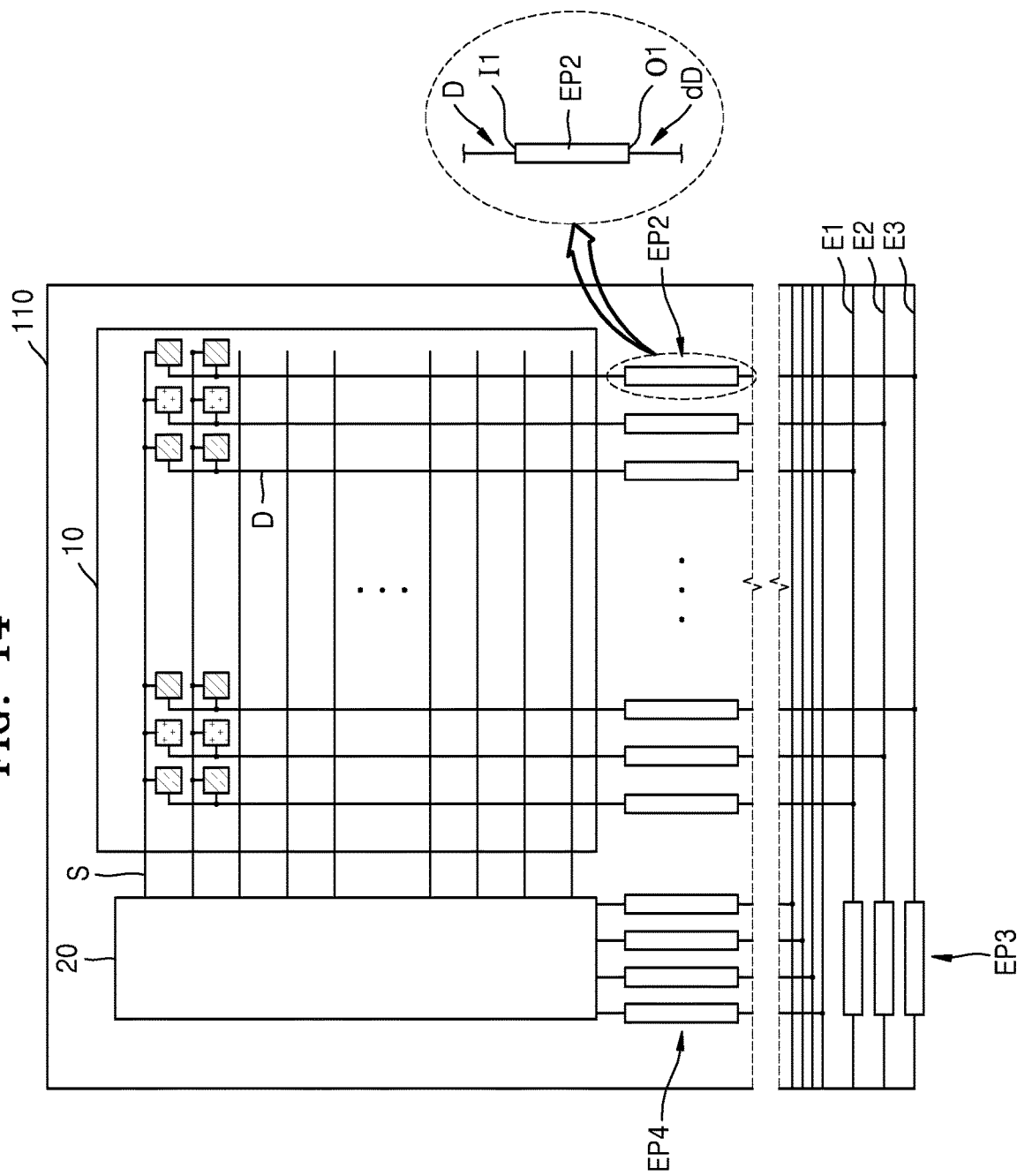
FIG. 14 is a reference diagram for describing a method of separating a display unit from an exposure line, according to an embodiment.

According to an embodiment, after forming the first pixel PR, second pixel PG and third pixel PB, the exposure controlling apparatus 200 may be removed. For example, as illustrated in FIG. 14, the substrate 110 may be separate into an area where the display unit 10 is formed and an area where the first through third exposure lines E1, E2, and E3 are formed, and area where the first through third exposure lines E1, E2, and E3 are formed may be removed. The data lines D between the second electrode pads EP2 and the first through third exposure lines E1, E2, and E3 may be cut to remove the first through third exposure lines E1, E2, and E3.

The data lines D may still remain in an outer portion of the second electrode pads EP2. Each of the second electrode pads EP2 may include a first side I1 that faces the display unit 10 and is relatively close to the display unit 10 and a second side O1 that is relatively far from the display unit 10.

The data lines D may extend to protrude toward the second side O1 of the first electrode pad EP1. The data lines D that protrude as described above do not contribute to a display operation, and thus may be referred to as dummy lines dD. Next, by combining the data driver 30 and other components, the display apparatus 1 may be completed.

As described above, as the color conversion layers 140R, 140B, and 140B are formed by being hardened by light emitted from an area of the emissive layer 120, at least one of a thickness, area, and shape of the first through third color conversion layers 140R, 140B, and 140B may be affected by properties of the emitted light. The properties of light may be at least one of an emission time of the light, an emission intensity, an area of light emission, and a range of light emission.

For example, the longer a light emission time of emitted light, the more a color conversion material may be hardened. Alternatively, the longer the emission time, the thicker the first through third color conversion layers 140R, 140B, and 140B in a thickness direction may be. Similarly, the higher the emission intensity, the higher a degree of hardening of a color conversion material may be. For example, the higher the emission intensity, the thicker the first through third color conversion layers 140R, 140G, and 140B in a thickness direction may be. Further, the greater an area of light emission of the emitted light, the greater an area of the hardened color conversion material in a horizontal direction may be.

As the first through third color conversion materials 310, 320, and 330 are hardened by light emitted from the emissive layer 120, an additional exposure apparatus for hardening the first through third color conversion materials 310, 320, and 330 is not necessary, thus increasing the efficiency of manufacturing of a display apparatus. In addition, since the light conversion materials are hardened by light emitted from the emissive layer 120, the first through third color conversion materials 310, 320, and 330 are exposed from a lower portion thereof, and thus, a defect that the first through third color conversion layers 140R, 140B, and 140B separate from the driving layer 130 may be prevented.

In addition, since the scan driver 20, which is an essential component of the display apparatus 1, is used without change for self-exposure of the display apparatus 1, the exposure time and the exposure intensity may be accurately controlled. Since one exposure line (the first, second, or third exposure lines E1, E2, or E3) is used to form one color conversion layer (the first, second, or third color conversion layer 140R, 140G, or 140B), control of an exposure signal may be easy.

Figure 15:
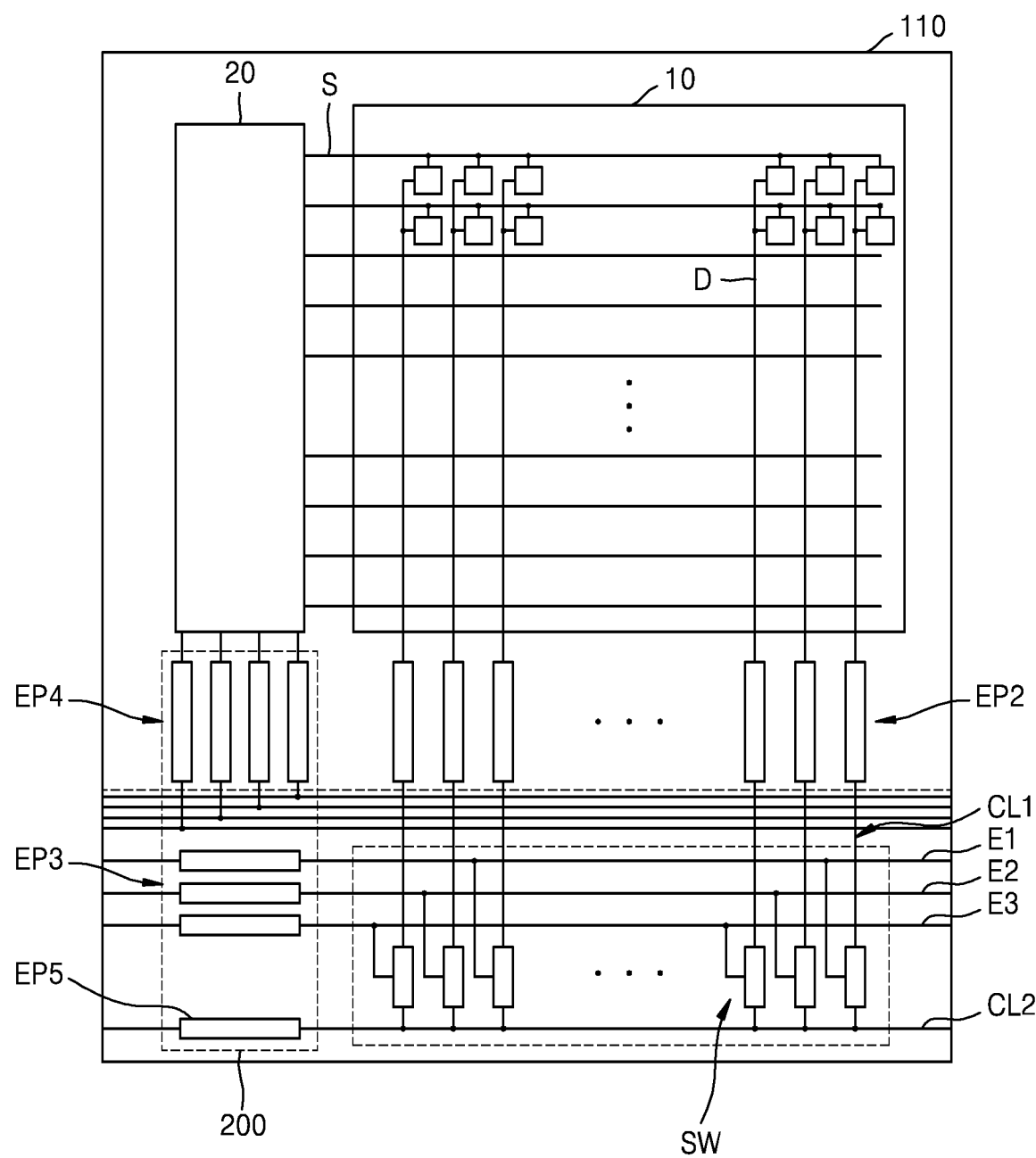
FIG. 15 illustrates a display apparatus including an exposure line according to an embodiment.

While removal of the first through third exposure lines E1, E2, and E3 by cutting the substrate 110 is described with reference to FIG. 14, the disclosure is not limited thereto. The first through third exposure lines E1, E2, and E3 may be included in the display apparatus 1. FIG. 15 illustrates a display apparatus including first through third exposure lines E1, E2, and E3 according to an embodiment. As illustrated in FIG. 15, in a non-display area NDA, first connection lines CL1 that are respectively electrically connected to data lines D, switching devices SW that are respectively electrically connected to the first connection lines CL1 and one of the first through third exposure lines E1, E2, and E3, a second connection line CL2 connected to the switching devices SW, and a fifth electrode pad EP5 arranged on the second connection line CL2 may be further arranged. The first connection lines CL1 may be arranged in a same direction as the data lines D, and may be formed of an identical material to that of the data lines D. Then, the second connection line CL2 may be arranged in a same direction as the scan lines S, and may be formed of an identical material to that of the scan lines S. The switching devices SW may be transistors.

Each switching device SW may be electrically connected to each data line D, and may be electrically connected to any one of the first through third exposure lines E1, E2, and E3. Switching devices SW connected to the first exposure line E1 may be referred to as a first group switching device; switching devices SW connected to the second exposure line E2 may be referred to as a second group switching device, and switching devices SW connected to the third exposure line E3 may be referred to as a third group switching device.

While the exposure controlling apparatus 200 has applied an on signal to the switching devices SW via the second connection line CL2 and a scan control signal to the scan driver 20, the exposure controlling apparatus 200 may apply an on signal Von to the first exposure line E1. Then the first group switching device connected to the first exposure line E1 may be turned on. The on signal Von of the first exposure line E1 may then be applied to the first pre-pixels PPR via the first group switching device SW, thereby emitting light. Accordingly, the first color conversion layer 140R may be formed.

Likewise, while the exposure controlling apparatus 200 has applied (an on signal to the switching devices SW via the second connection line CL2 and a scan control signal to the scan driver 20, the exposure controlling apparatus 200 may apply an on signal Von to the second exposure line E2, thereby turning on the second group switching device connected to the second exposure line E2. The on signal Von of the second exposure line E2 may then be applied to the second pre-pixels PPG via the second group switching device SW, thereby emitting light. Accordingly, the second color conversion layer 140G may be formed. The third color conversion layer 140B may also be formed in the same manner.

When formation of the first through third color conversion layers 140R, 140B, and 140B is completed, the exposure controlling apparatus 200 may turn off the switching devices SW. Next, the switching devices SW may be controlled using the processor 40 such that the switching devices SW are maintained in an off state.

Figure 16:
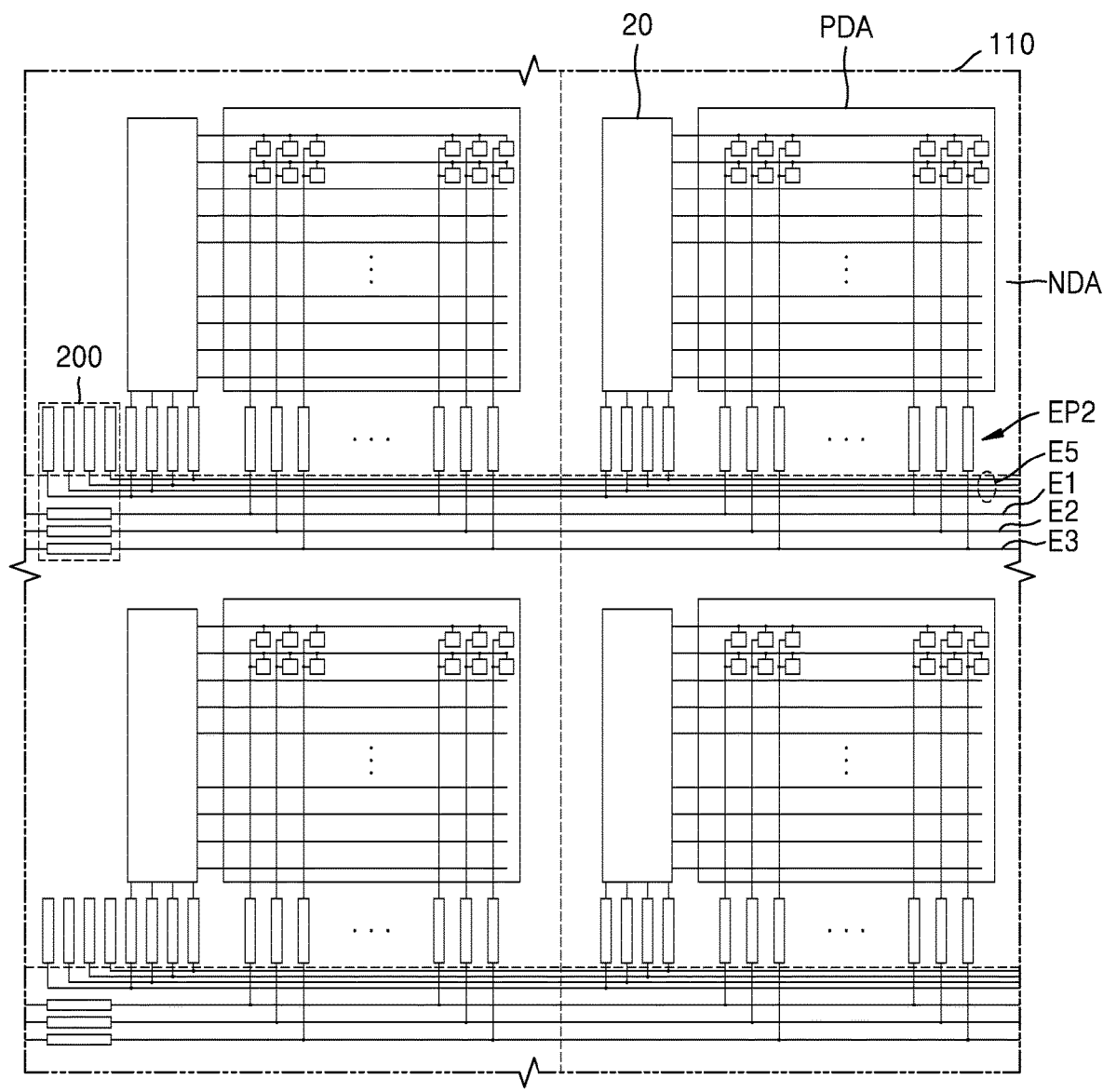
FIG. 16 illustrates a substrate on which a plurality of pre-display areas are formed, according to an embodiment.

While the first through third exposure lines E1, E2, and E3 are described as being connected in one display area, the disclosure is not limited thereto. A plurality of display areas DA may also be manufactured on one substrate 110. FIG. 16 illustrates a substrate 110 on which a plurality of pre-display areas PDA are formed. As illustrated in FIG. 16, a plurality of each of emissive layers and driving layers that are spaced apart from each other may be formed on the substrate 110. An area of the substrate 110 where an emissive layer and a driving layer are formed may be referred to as a pre-display area PDA, and regions except the display area DA may be a non-display area NDA. Some elements of the driving layer 130, that is, scan lines S and data lines D, may extend to the non-display area NDA. In the non-display area NDA, a plurality of scan drivers 20 connected to the scan lines S respectively included in the plurality of driving layers may be arranged.

In addition, in the non-display area NDA, first through third exposure lines E1, E2, and E3 that are electrically connected to the data lines D may be arranged. The data lines D may be classified into a plurality of groups, and data lines D of each group may be electrically connected to each of the first through third exposure lines E1, E2, and E3. For example, first group data lines for emitting red light may be connected to the first exposure line E1, and second group data lines for emitting green light may be connected to the second exposure line E2, and third group data lines for emitting blue light may be connected to the third exposure line E3. The plurality of driving layers may share the exposure lines E1, E2, and E3.

In addition, scan control lines E5 connected to the plurality of scan drivers 20 may be arranged in the non-display area NDA. The plurality of scan drivers 20 may share the scan control lines. Thus, one exposure controlling apparatus 200 may respectively and simultaneously form color conversion layers on a plurality of driving layers. A method of forming each of the color conversion layers is identical to a method of forming a color conversion layer on one driving layer, and thus, detailed description thereof will be omitted.

As the color conversion layers are formed, display units that are spaced apart from each other on one substrate 110 may be formed. The substrate 110 may be cut into units of the display units, and portions of the substrate 110 on which the first through third exposure lines E1, E2, and E3 and the scan control lines E5 are formed may be removed.

Figure 17:
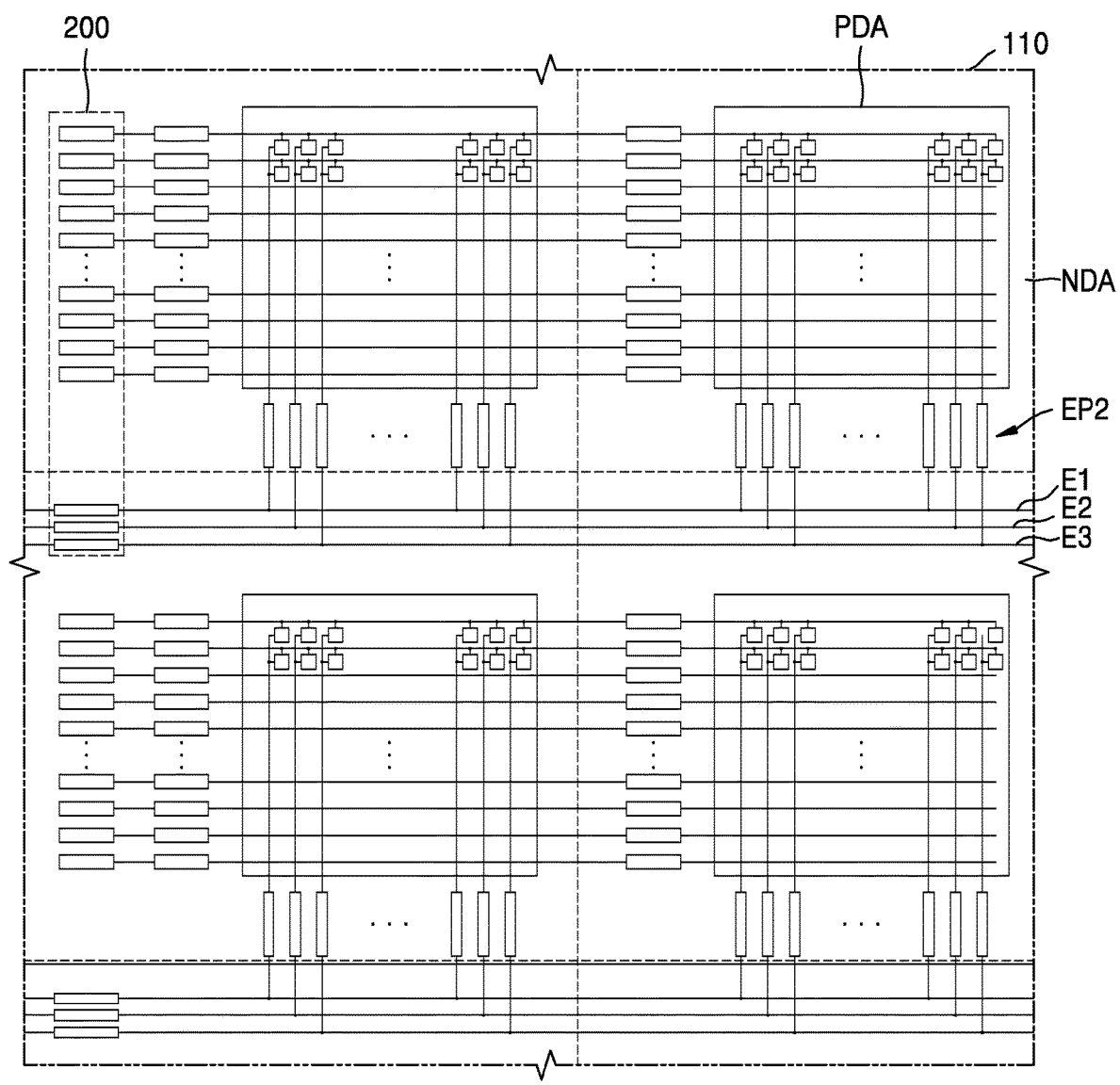
FIG. 17 is a reference diagram illustrating a method of forming a color conversion layer without using a scan driver, according to an embodiment.

While forming of a color conversion layer by using the scan drivers 20 is described above, the disclosure is not limited thereto. FIG. 17 is a reference diagram illustrating a method of forming a color conversion layer without using a scan driver, according to an embodiment. As illustrated in FIG. 17, a pre-display area PDA may be formed on the substrate 110. The pre-display area PDA may include an emissive layer and a driving layer. A plurality of pre-display areas PDAs arranged in a same column on the substrate 110 may share scan lines S. The scan lines S may be connected to an exposure controlling apparatus 200. Accordingly, the exposure controlling apparatus 200 may directly apply a scan signal to the plurality of pre-display areas PDA. Alternatively, while the scan lines S are turned on, the exposure controlling apparatus 200 may sequentially apply an on signal Von to first through third exposure lines E1, E2, and E3 to form first through third color conversion layers 140R, 140B, and 140B. As the first through third color conversion layers 140R, 140B, and 140B are formed, a plurality of display units 10 may be formed on the substrate 110.

Figure 18:
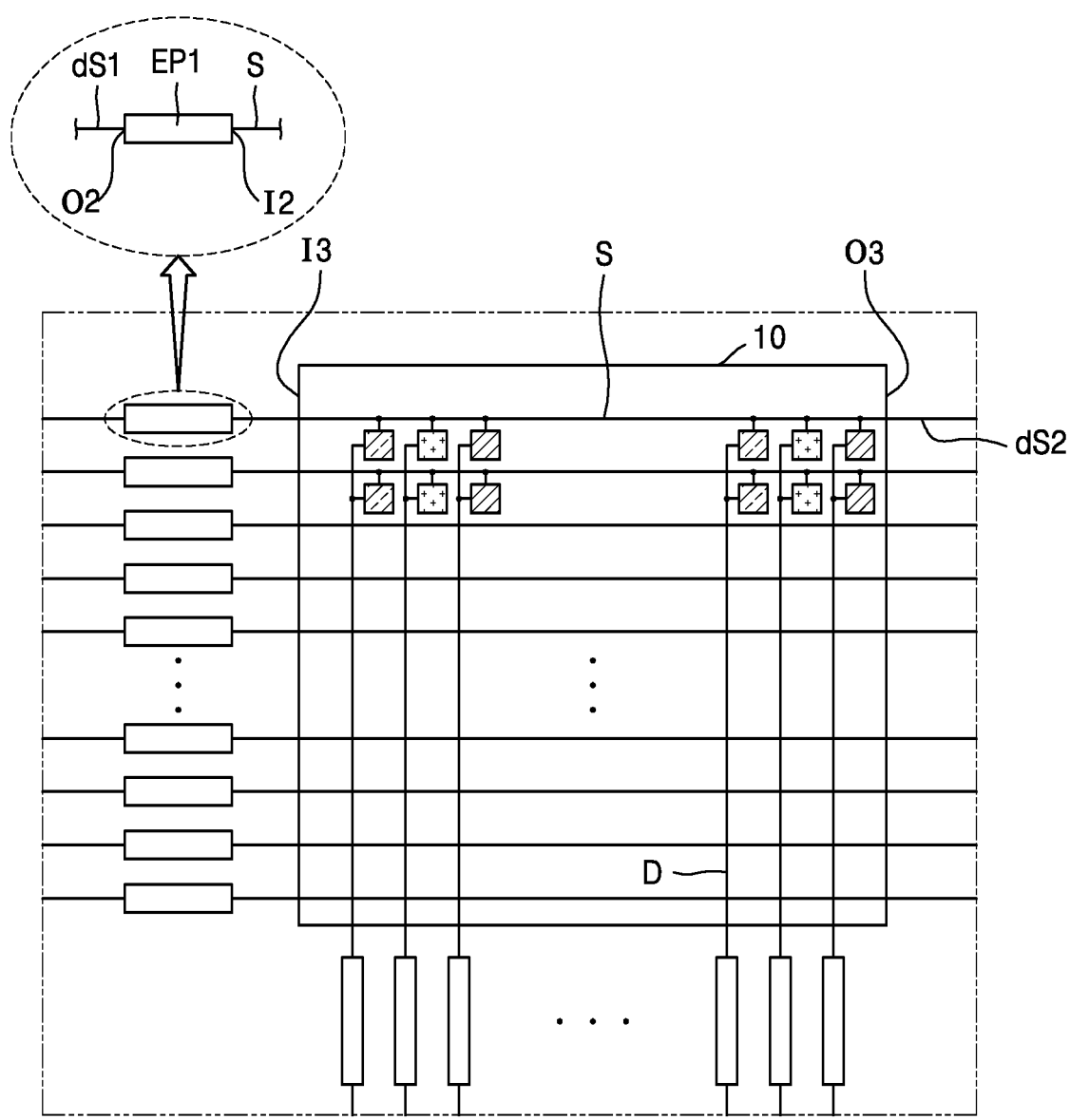
FIG. 18 illustrates an example of a substrate that is cut in the embodiment of FIG. 17.

After completing the first through third color conversion layers 140R, 140B, and 140B, the substrate 110 may be cut in units of the display units 10. FIG. 18 illustrates an example of the substrate 110 that is cut in the embodiment of FIG. 17. As illustrated in FIG. 18, as the substrate 110 is cut in units of the display units 10, the scan lines S may protrude out of the first electrode pads EP1 and the display unit 10 and remain.

For example, the first electrode pads EP1 may include a first side I2 that faces the display unit 10 and is relatively close to the display unit 10 and a second side O2 that is relatively far from the display unit 10. The scan lines S may remain to protrude out of the second side O2 of the first electrode pads EP1. In addition, the display unit 10 may include a first side I3 that faces the first electrode pads EP1 and is relatively close to the first electrode pads EP1 and a second side O3 that is relatively far from the first electrode pads EP1. The scan lines S may remain by protruding out of the second side O3 of the display unit 10. An area of the scan lines S remaining by protruding out of the second side O2 of the first electrode pads EP1 and an area of the scan line S remaining by protruding out of the second side O3 of the display unit 10 do not contribute to a displaying operation, and thus these areas may be referred to as dummy lines dS1 and dS2.

Figure 19:
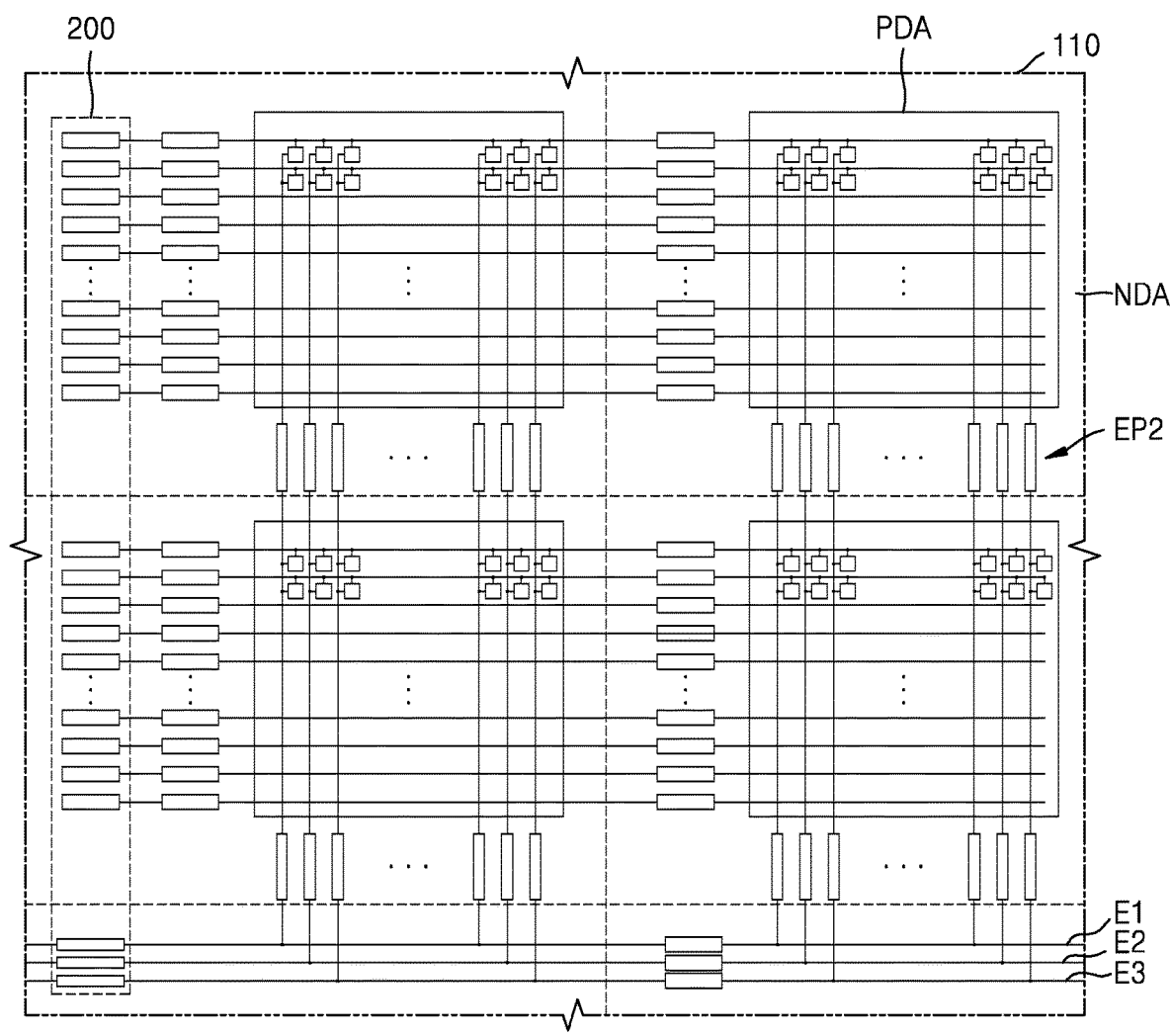
FIG. 19 is a reference diagram for describing a method of forming a color conversion layer, according to another embodiment.

FIG. 19 is a reference diagram for describing a method of forming a color conversion layer according to another embodiment. When comparing FIGS. 17 and 19, a plurality of pre-display area PDA arranged in a same row on the substrate 110 illustrated in FIG. 19 may share data lines D. Thus, the exposure controlling apparatus 200 may form a color conversion layer on the driving layer 130 that is arranged not only on a same row but also on a same column, by using one exposure signal. Accordingly, the exposure controlling apparatus 200 may directly apply a scan signal to a plurality of driving layers 130. Alternatively, while the scan lines S are turned on, the exposure controlling apparatus 200 may sequentially apply an on signal Von to the first through third exposure lines E1, E2, and E3 to thereby form a color conversion layer. As the color conversion layer is formed, a plurality of display units may be formed on the substrate 110.

Figure 20:
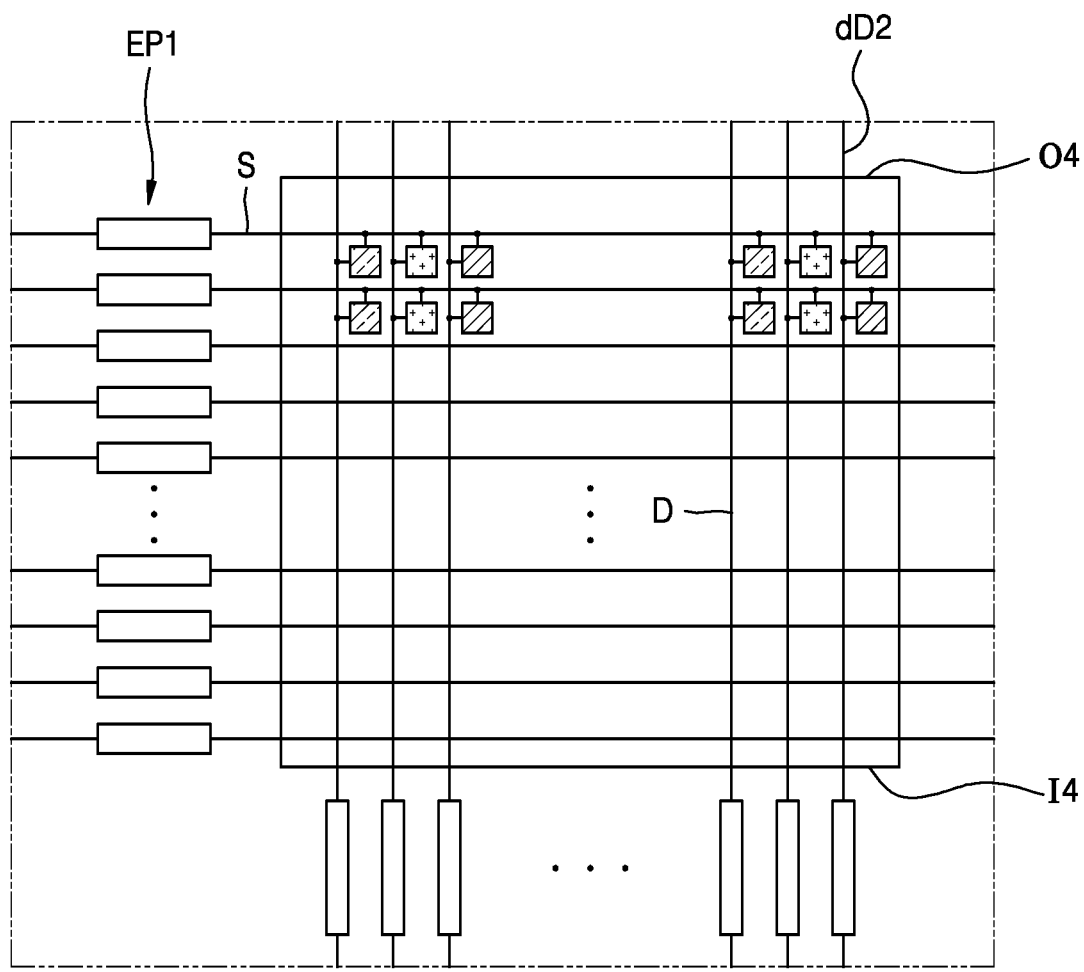
FIG. 20 illustrates an example of a substrate that is cut in the embodiment of FIG. 19.

After completing the color conversion layer, the substrate 110 may be cut in units of the display units. FIG. 20 illustrates an example of the substrate 110 that is cut in the embodiment of FIG. 19. As illustrated in FIG. 20, as the substrate 110 is cut in units of the display units 10, the data lines D may protrude out of the display unit 10 and remain.

For example, the display unit 10 may include a third side I4 that faces the second electrode pads EP2 and is relatively close to the second electrode pads EP2 and a fourth side O4 that is relatively far from the second electrode pads EP2. The data lines D may remain by protruding out of the fourth side O4 of the display unit 10. An area of the data lines D remaining by protruding out of the fourth side O4 of the display unit 10 do not contribute to a display operation, and thus may be referred to as a dummy line dD2.

Figure 21:
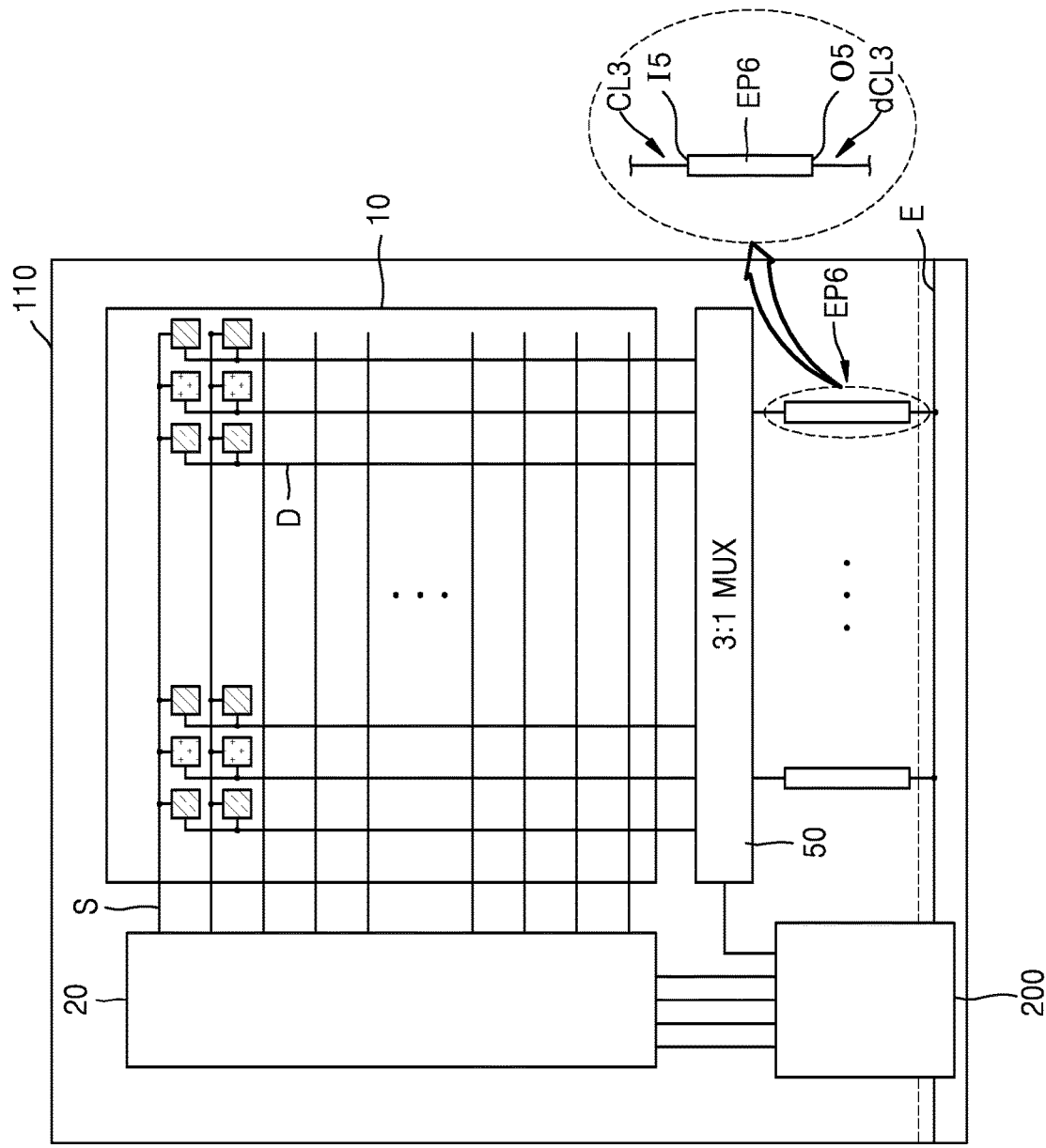
FIG. 21 is a reference diagram illustrating a method of forming a color conversion layer in a display apparatus including a switching circuit, according to another embodiment.

FIG. 21 is a reference diagram illustrating a method of forming a color conversion layer in a display apparatus including a switching circuit 50, according to another embodiment. As illustrated in FIG. 21, the display apparatus may include a switching circuit 50. The switching circuit 50 may be implemented in a form of a 3:1 MUX (i.e., multiplexer). The data lines D may be connected to the switching circuit 50 as those data lines D connected to pixels that are used to obtain white balance are grouped. Then the switching circuit 50 may be electrically connected to one exposure line E via a third connection line CL3. Sixth pad electrodes EP6 that may be in contact with a data driver may be formed in the third connection line CL3. When an on signal Von is applied to the exposure line E, the switching circuit 50 may turn on switching devices SW for each color, thereby forming a color conversion layer.

The exposure controlling apparatus 200 may form a color conversion layer by controlling the switching circuit 50 and the scan driver 20 while an on signal Von is applied to the exposure line E. However, the disclosure is not limited thereto, and a switching circuit may also be implemented in the form of a MUX of n:1 (where n is an integer greater than 2). As is obvious, a plurality of exposure lines may be included according to a form of the switching circuit 50. After the color conversion layer is formed, the third connection line CL3 may be cut, thereby removing the exposure line E. The third connection line CL3 may protrude outside the sixth electrode pads EP6 and remain.

For example, the sixth electrode pads EP6 may include a first side I5 that faces the display unit 10 and is relatively close to the display unit 10 and a second side O5 that is relatively far from the display unit 10. The third connection line CL3 may remain by protruding toward the second side O5 of the sixth electrode pads EP6. An area of the third connection line CL3 remaining by protruding out of the second side O5 of the sixth electrode pads EP6 does not contribute to a display operation, and thus may be referred to as a dummy line Dcl3.

Figure 22:
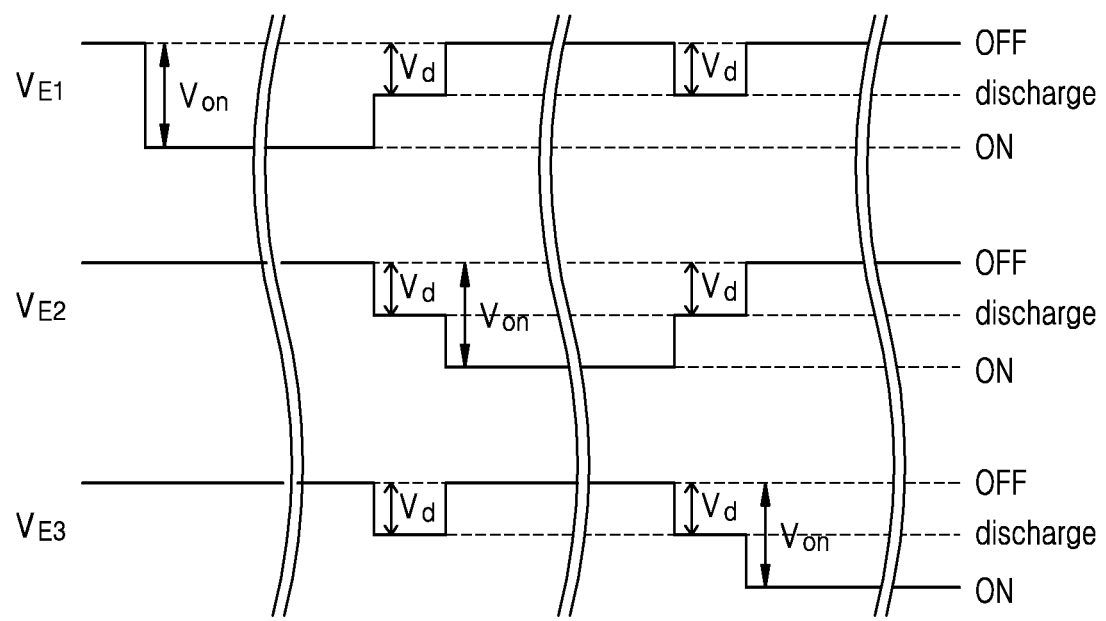
FIG. 22 is a reference diagram illustrating a method of applying a signal to exposure lines, according to another embodiment.

FIG. 22 is a reference diagram illustrating a method of applying a signal to first through third exposure lines E1, E2, and E3, according to another embodiment. Before applying an on signal Von to the first through third exposure lines E1, E2, and E3, a discharge signal Vd may be applied to the first through third exposure lines E1, E2, and E3. For example, after forming a first exposure line E1 by applying an on signal Von to the first exposure line E1, a discharge signal Vd may be applied to the first through third exposure lines E1, E2, and E3 to discharge a charge present in the emissive layer 120 and the driving layer 130. Then, after forming a second color conversion layer 140G by applying an on signal Von to the second exposure line E2, a discharge signal Vd may be applied to the first through third exposure lines E1, E2, and E3 to discharge a charge present in the emissive layer 120 and the driving layer 130. Also, after forming a third color conversion layer 140B by applying an on signal Von to the third exposure line E3, a discharge signal Vd may be applied to the first through third exposure lines E1, E2, and E3 to discharge a charge present in the emissive layer 120 and the driving layer 130.

Amplitude of the discharge signal Vd may be equal to that of a common voltage applied to the display apparatus. When the charge present in the emissive layer 120 and the driving layer 130 is discharged, emission of light from a light-emission area to which no exposure signal is applied may be prevented.

The method of forming a color conversion layer with respect to RGB pixels is described above. However, the method is not limited thereto. The same method may also apply to RGGR pixels. A same exposure line may be connected to same pre-pixels. Light may be emitted from a certain light-emission area based on a combination of an exposure signal and a scan signal. A color conversion layer of various pixel types such as RGBW pixels may be formed.

According to an embodiment, a semiconductor device may be provided having a substrate, an emissive layer provided on a substrate, a driving layer provided on the emissive layer and a semiconductor layer self formed on the driving layer, the semiconductor layer hardened based on light emitted from the emissive layer.

The self-formed semiconductor layer may be a color conversion layer.

The semiconductor layer may include quantum dots.

According to an embodiment, a method of manufacturing the semiconductor device may be provided. The method may include providing an emissive layer on a substrate, providing a driving layer provided on the emissive layer providing a semiconductor layer formed on the driving layer and hardening the semiconductor layer based on light emitted from the emissive layer.

While the disclosure has been particularly shown and described with reference to embodiments thereof, it will be understood by one of ordinary skill in the art that various changes in form and details may be made therein without departing from the spirit and scope of the disclosure as defined by the following claims. Thus, the embodiments should be considered in a descriptive sense only and not for purposes of limitation. Therefore, the scope of the disclosure is defined not by the detailed description of the disclosure but by the following claims, and all differences within the scope will be construed as being included in the disclosure.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   an emissive layer on a first area of a substrate;
   a driving layer comprising a plurality of driving elements used to emit light from the emissive layer;
   an exposure line on a second area of the substrate, the exposure line being electrically connected to the driving layer; and
   a color conversion layer on the emissive layer,
   wherein a signal is applied to the exposure line to emit the light from an area of the emissive layer corresponding to the exposure line to an area of the color conversion layer corresponding to the exposure line.

2. The display apparatus of claim 1, wherein the signal is used to harden the color conversion layer.

3. The display apparatus of claim 1, wherein the color conversion layer comprises quantum dots.

4. The display apparatus of claim 1, wherein the emissive layer comprises:
   a plurality of light-emission areas respectively corresponding to a plurality of pixels.

5. The display apparatus of claim 1, wherein the driving layer comprises:
   a plurality of scan lines extending in a first direction; and
   a plurality of data lines extending in a second direction intersecting the first direction,
   wherein the plurality of driving elements are respectively connected to the plurality of scan lines and the plurality of data lines, and
   the plurality of data lines are electrically connected to the exposure line.

6. The display apparatus of claim 5, wherein the exposure line extends in a direction intersecting the second direction.

7. The display apparatus of claim 5, wherein the exposure line extends in the first direction.

8. The display apparatus of claim 5, wherein the exposure line comprises:
   a first exposure line for hardening a first color conversion layer of the color conversion layer; and
   a second exposure line for hardening a second color conversion layer of the color conversion layer,
   wherein the first exposure line is connected to a first group data line from among the plurality of data lines, and
   the second exposure line is connected to a second group data line from among the plurality of data lines.

9. The display apparatus of claim 8, wherein, when an on signal is applied to the first exposure line, an off signal is applied to the second exposure line, and
   when an on signal is applied to the second exposure line, an off signal is applied to the first exposure line.

10. The display apparatus of claim 8, wherein a third signal is further applied to the first exposure line and the second exposure line to discharge a charge in the emissive layer and the plurality of driving elements.

11. The display apparatus of claim 5, wherein the signal is applied while a scan signal is applied to the plurality of scan lines.

12. The display apparatus of claim 5, wherein the signal is applied while an on signal is applied to the plurality of scan lines.

13. The display apparatus of claim 5, wherein the exposure line is directly connected to one or more of the plurality of data lines.

14. The display apparatus of claim 5, wherein the exposure line is electrically connected to the plurality of data lines via a switching device.

15. The display apparatus of claim 14, wherein the switching device comprises a plurality of transistors which electrically connect each of the plurality of data lines to the exposure line.

16. The display apparatus of claim 14, wherein the switching device comprises a multiplexer.

17. The display apparatus of claim 1, further comprising a plurality of barriers defining a pixel on the driving layer.

18. The display apparatus of claim 17, wherein at least one of the plurality of barriers has a tapered shape with a width decreasing from a lower portion to an upper portion thereof.

19. The display apparatus of claim 17, wherein a size of the pixel is 500 ppi or more.

20. The display apparatus of claim 1, wherein the emissive layer, the driving layer, the exposure line, and the color conversion layer are monolithical structure.

* * * * *